(12) United States Patent
Shimada

(10) Patent No.: US 10,361,032 B2
(45) Date of Patent: *Jul. 23, 2019

(54) CERAMIC CAPACITOR INCLUDING FIRST, SECOND, AND THIRD EXTERNAL ELECTRODES WRAPPING AROUND SIDE AND PRINCIPAL SURFACES

(71) Applicant: Murata Manufacturing Co., Ltd., Nagaokakyo-shi, Kyoto-fu (JP)

(72) Inventor: Yasuyuki Shimada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/608,126

(22) Filed: May 30, 2017

(65) Prior Publication Data

US 2017/0345562 A1    Nov. 30, 2017

(30) Foreign Application Priority Data

May 31, 2016   (JP) ................................ 2016-108582

(51) Int. Cl.
*H01G 4/232*   (2006.01)
*H01G 4/30*    (2006.01)
(Continued)

(52) U.S. Cl.
CPC ............. *H01G 4/232* (2013.01); *H01G 2/06* (2013.01); *H01G 4/005* (2013.01); *H01G 4/012* (2013.01);
(Continued)

(58) Field of Classification Search
CPC ............................ H01G 4/005; H01G 4/1209
See application file for complete search history.

(56) References Cited

U.S. PATENT DOCUMENTS

| 6,445,593 B1 * | 9/2002 | Okuyama | ........... H01F 17/0013 |
| | | | 257/421 |
| 6,610,925 B1 * | 8/2003 | Wajima | ................ H01C 1/142 |
| | | | 174/535 |

(Continued)

FOREIGN PATENT DOCUMENTS

| JP | 11121251 A | * | 4/1999 |
| JP | 2001-057311 A |   | 2/2001 |

(Continued)

OTHER PUBLICATIONS

Official Communication issued in corresponding Korean Patent Application No. 10-2017-0065146, dated Apr. 2, 2018.
(Continued)

*Primary Examiner* — David M Sinclair
(74) *Attorney, Agent, or Firm* — Keating & Bennett, LLP

(57) ABSTRACT

A ceramic capacitor that has low ESL and is suitable to be built into a substrate includes a first external electrode including a first portion extending from a portion located on a first principal surface to a portion of a first end surface, a second portion extending from a portion located on a second principal surface to a portion of the first end surface, a third portion extending from a portion located on a first side surface to a portion of the first end surface, and a fourth portion extending from a portion located on a second side surface to a portion of the first end surface. The first external electrode includes an outermost layer that is a Cu plated layer.

20 Claims, 9 Drawing Sheets

(51) Int. Cl.
   *H01G 4/005* (2006.01)
   *H01G 4/12* (2006.01)
   *H01G 2/06* (2006.01)
   *H01G 4/012* (2006.01)
   *C23C 14/34* (2006.01)

(52) U.S. Cl.
   CPC .............. *H01G 4/12* (2013.01); *H01G 4/1209* (2013.01); *H01G 4/2325* (2013.01); *H01G 4/30* (2013.01); *H01G 4/302* (2013.01); *C23C 14/34* (2013.01); *H01G 4/306* (2013.01)

(56) References Cited

U.S. PATENT DOCUMENTS

| | | | | |
|---|---|---|---|---|
| 9,214,282 B1* | 12/2015 | Ikeda | ................ | H01G 4/30 |
| 2001/0019176 A1* | 9/2001 | Ahiko | ................ | H01G 4/012 |
| | | | | 257/777 |
| 2009/0086406 A1* | 4/2009 | Lee | ................ | H01G 4/228 |
| | | | | 361/306.3 |
| 2009/0284896 A1* | 11/2009 | Sakaguchi | ............ | H01G 4/005 |
| | | | | 361/303 |
| 2012/0018205 A1 | 1/2012 | Sato et al. | | |
| 2012/0194031 A1* | 8/2012 | Ogawa | ................ | H01G 4/005 |
| | | | | 310/311 |
| 2015/0014037 A1* | 1/2015 | Ahn | ................ | H01G 4/30 |
| | | | | 174/260 |
| 2015/0041198 A1* | 2/2015 | Lee | ................ | H01G 2/06 |
| | | | | 174/260 |
| 2015/0109718 A1* | 4/2015 | Choi | ................ | H01G 2/06 |
| | | | | 361/304 |
| 2015/0221453 A1* | 8/2015 | Sawada | ................ | H01G 13/006 |
| | | | | 156/325 |
| 2016/0189867 A1* | 6/2016 | Zaima | ................ | H01G 4/30 |
| | | | | 361/301.4 |
| 2017/0169951 A1* | 6/2017 | Shimada | ................ | H01G 4/008 |
| 2017/0345561 A1* | 11/2017 | Asai | ................ | H01G 4/306 |
| 2017/0345563 A1* | 11/2017 | Usui | ................ | H01G 4/232 |
| 2017/0345565 A1* | 11/2017 | Usui | ................ | H01G 4/005 |
| 2017/0345566 A1* | 11/2017 | Tanaka | ................ | H01G 4/005 |

FOREIGN PATENT DOCUMENTS

| | | |
|---|---|---|
| JP | 2001-102243 A | 4/2001 |
| JP | 2001-155962 A | 6/2001 |
| JP | 2002-367852 A | 12/2002 |
| JP | 2012-028456 A | 2/2012 |
| JP | 2012-114457 A | 6/2012 |
| KR | 10-2014-0038871 A | 3/2014 |
| KR | 10-2015-0046712 A | 4/2015 |

OTHER PUBLICATIONS

Usui, "Ceramic Capacitor," U.S. Appl. No. 15/607,763, filed May 30, 2017.

Usui, "Ceramic Capacitor," U.S. Appl. No. 15/608,149, filed May 30, 2017.

Asai, "Ceramic Capacitor," U.S. Appl. No. 15/607,762, filed May 30, 2017.

Tanaka, "Ceramic Capacitor," U.S. Appl. No. 15/607,767, filed May 30, 2017.

\* cited by examiner ized to be mounted in electronic devices and electronic components to be mounted on substrates have been also progressively reduced in size. Electronic components to be mounted on substrates have been also progressively mounted at higher density. In order to achieve further reduction in size for electronic components, built-in electronic component substrates with electronic components embedded in the substrates have been also developed (for example, Japanese Patent Application Laid-Open No. 2012-114457). In the case of the built-in electronic component substrates, there is a need to ensure that wirings formed on the substrates and the embedded electronic components are electrically connected.

CERAMIC CAPACITOR INCLUDING FIRST, SECOND, AND THIRD EXTERNAL ELECTRODES WRAPPING AROUND SIDE AND PRINCIPAL SURFACES

CROSS REFERENCE TO RELATED APPLICATIONS

This application claims the benefit of priority to Japanese Patent Application No. 2016-108582 filed on May 31, 2016. The entire contents of this application are hereby incorporated herein by reference.

BACKGROUND OF THE INVENTION

1. Field of the Invention

The present invention relates to a ceramic capacitor.

2. Description of the Related Art

In recent years, information terminal devices such as cellular phones and portable music players have been progressively reduced in size and made thinner. Accordingly, substrates to be mounted in electronic devices and electronic components to be mounted on substrates have been also progressively reduced in size. Electronic components to be mounted on substrates have been also progressively mounted at higher density. In order to achieve further reduction in size for electronic components, built-in electronic component substrates with electronic components embedded in the substrates have been also developed (for example, Japanese Patent Application Laid-Open No. 2012-114457). In the case of the built-in electronic component substrates, there is a need to ensure that wirings formed on the substrates and the embedded electronic components are electrically connected.

In addition, with increases in the amount of information in electronic devices, electronic devices have been more frequently used in higher frequency areas. Therefore, electronic components built in the built-in electronic component substrates have been requested to have reduced equivalent series inductance (ESL) lowered to allow use in high frequency areas.

For example, Japanese Patent Application Laid-Open No. 2001-155962 and Japanese Patent Application Laid-Open No. 2001-102243 propose multi-terminal capacitors such as three-terminal capacitors, as a means for achieving lower ESL of ceramic capacitors. However, the multi-terminal capacitors disclosed in Japanese Patent Application Laid-Open No. 2001-155962 and Japanese Patent Application Laid-Open No. 2001-102243 fail to consider embedding into substrates and electrical connections to wirings formed on substrates. For this reason, it is difficult to embed, in a preferred manner, the multi-terminal capacitors disclosed in Japanese Patent Application Laid-Open No. 2001-155962 and Japanese Patent Application Laid-Open No. 2001-102243 into substrates. In other words, the multi-terminal capacitors disclosed in Japanese Patent Application Laid-Open No. 2001-155962 and Japanese Patent Application Laid-Open No. 2001-102243 are not preferred for embedding into substrates.

Therefore, ceramic capacitors have been required which are low in ESL, and preferred for embedding into substrates.

In addition, there is a need to reduce the height dimensions of ceramic capacitors for embedding into substrates. Therefore, the decreased height dimensions of the ceramic capacitors have a tendency to cause the ceramic capacitors to undergo decreases in strength. Accordingly, problems such as generation of breakage or cracks may be developed with the ceramic capacitors.

In addition, ceramic capacitors built into substrates typically have the problem of low adhesion to the substrates. The low adhesion force between the ceramic capacitors and the substrates includes the possibility of separating the ceramic capacitors and the resins constituting the substrates from each other, thus degrading reliability of the ceramic capacitors due to ingress of water from the separated portions into the substrates, or fracturing connections between via hole electrodes and external electrodes of the ceramic capacitors.

SUMMARY OF THE INVENTION

Preferred embodiments of the present invention provide a ceramic capacitor which is low in ESL and suitable to be built into a substrate.

A ceramic capacitor according to a preferred embodiment of the present invention includes a capacitor main body, a plurality of internal electrodes, and external electrodes. The capacitor main body includes first and second principal surfaces, first and second side surfaces, and first and second end surfaces. The first and second principal surfaces extend in a length direction and a width direction. The width direction is perpendicular or substantially perpendicular to the length direction. The first and second side surfaces extend in the length direction and a laminating direction. The laminating direction is perpendicular or substantially perpendicular to each of the length direction and the width direction. The first and second end surfaces extend in the width direction and the laminating direction. The plurality of internal electrodes are disposed in the capacitor main body. The plurality of internal electrodes are exposed at each of the first and second side surfaces. The plurality of external electrodes cover from an exposed portion of the internal electrode at the first side surface and an exposed portion of the internal electrode at the second side surface, to the first and second principal surfaces. The plurality of internal electrodes include a first internal electrode and a second internal electrode. The second internal electrode is opposed to the first internal electrode in the laminating direction. The first internal electrode includes a first opposed portion, first and second extended portions, and third and fourth extended portions. The first opposed portion is opposed to the second internal electrode. The first and second extended portions are connected to the first opposed portion. The first and second extended portions are each extended to the first side surface. The third and fourth extended portions are connected to the first opposed portion. The third and fourth extended portions are each extended to the second side surface. The second internal electrode includes a fifth extended portion and a sixth extended portion. The second opposed portion is opposed to the first opposed portion. The fifth extended portion is connected to the second opposed portion. The fifth extended portion is extended to the first side surface. The sixth extended portion is connected to the second opposed portion. The sixth extended portion is extended to the second side surface. The plurality of external electrodes include a first external electrode, a second external electrode, and a third external electrode. The first external electrode covers an exposed portion of the first extended portion at the first side surface and an exposed portion of the third extended portion at the second side surface, and wraps around the first side surface, the first principal surface, the second side surface, and the second principal surface. The second external electrode covers an exposed portion of the second extended portion at the first side surface and an exposed portion of the fourth extended portion at the second side surface, and wraps around the first side surface, the first principal surface, the second side surface, and the second principal surface. The third external electrode covers an exposed portion of the fifth extended portion at the first side surface and an exposed portion of the sixth extended portion at the second side surface, and wraps around the first side surface, the first principal surface, the second side surface, and the second principal surface. The first external electrode includes a first portion, a second portion, a third portion, and a fourth portion. The first portion extends from a portion located on the first principal surface to a portion of the first end surface. The second portion extends from a portion located on the second principal surface to a portion of the first end surface. The third portion extends from a portion located on the first side surface to a portion of the first end surface. The fourth portion extends from a portion located on the second side surface to a portion of the first end surface. The second external electrode includes a fifth portion, a sixth portion, a seventh portion, and an eighth portion. The fifth portion extends from a portion located on the first principal surface to a portion of the second end surface. The sixth portion extends from a portion located on the second principal surface to a portion of the second end surface. The seventh portion extends from a portion located on the first side surface to a portion of the second end surface. The eighth portion extends from a portion located on the second side surface to a portion of the second end surface. The first and second external electrodes each include an outermost layer made of a Cu plated layer.

A ceramic capacitor according to a preferred embodiment of the present invention is easily built into a substrate, because the outermost layers of the external electrodes include the Cu plated layers. Specifically, to build the ceramic capacitor into a substrate, via hole electrodes are preferably provided to connect electronic components to wirings of the substrate, and thus via holes leading to the external electrodes of the electronic components with the use of, for example, a $CO_2$ laser or the like and preferably provided in the substrate. In this regard, for a ceramic capacitor according to a preferred embodiment of the present invention, the outermost layers of the external electrodes include the Cu plated layers. For this reason, laser light for irradiation for the formation of the via holes is reflected at high reflectivity by the external electrodes, and ceramic capacitor degradation thus is significantly reduced or prevented. Accordingly, a ceramic capacitor according to a preferred embodiment of the present invention is easily built into a substrate.

In addition, a ceramic capacitor according to a preferred embodiment of the present invention is configured such that the extended portions of the first and second internal electrodes are all extended to the first and second side surfaces of the capacitor main body, thus making it possible to reduce the interval between the extended portion of the first internal electrode and the extended portion of the second internal electrode. For this reason, the path length of current flow is able to be reduced in the ceramic capacitor. Accordingly, a ceramic capacitor according to a preferred embodiment of the present invention includes low equivalent series inductance (ESL).

In a ceramic capacitor according to a preferred embodiment of the present invention, the lengths of the first and second portions, and of the fifth and sixth portions in the laminating direction are each preferably about 5% or more and about 15% or less of the dimension of the ceramic capacitor in the laminating direction, for example. The lengths of the third and fourth portions, and of the seventh and eighth portions in the laminating direction are each preferably about 5% or more and about 15% or less of the width dimension of the ceramic capacitor, for example.

In a ceramic capacitor according to a preferred embodiment of the present invention, respective lengths of the first, second, fifth, and sixth portions in the laminating direction are preferably smaller than lengths of the third, fourth, seventh, and eighth portions in the width direction.

In a ceramic capacitor according to a preferred embodiment of the present invention, the dimension of the ceramic capacitor in the laminating direction is preferably smaller than the dimension of the ceramic capacitor in the width direction.

In a ceramic capacitor according to a preferred embodiment of the present invention, the length of a portion of the third external electrode located on the first or second principal surface in the length direction is preferably larger than the length of a portion of the third external electrode located on the first or second side surface in the length direction.

In a ceramic capacitor according to a preferred embodiment of the present invention, the length of a portion of the first external electrode located on the first or second principal surface in the length direction is preferably larger than the length of a portion of the first external electrode located on the first and second side surfaces in the length direction. The length of a portion of the second external electrode located on the first or second principal surface in the length direction is preferably larger than the length of a portion of the second external electrode located on the first and second side surfaces in the length direction.

In a ceramic capacitor according to a preferred embodiment of the present invention, when the maximum length in the length direction, of portions of the first and second external electrodes located on the first or second principal surface, is denoted by L1, whereas the maximum length in the length direction from a portion farthest from the capacitor main body in the laminating direction, of the portions of the first and second external electrodes located on the first or second principal surface, to a portion closer to the capacitor main body by about 40% of the thickness of the first or second external electrode in the laminating direction is denoted by L2, the ratio L2/L1 is preferably about 80% or more. When the maximum length in the length direction, of a portion of the third external electrode located on the first or second principal surface, is denoted by L3, whereas the maximum length in the length direction from a portion farthest from the capacitor main body in the laminating direction, of the portion of the third external electrode located on the first or second principal surface, to a portion closer to the capacitor main body by about 40% of the thickness of the third external electrode in the laminating direction is denoted by L4, the ratio L4/L3 is preferably about 80% or more, for example.

In a ceramic capacitor according to a preferred embodiment of the present invention, the length of a portion of at least one of the first to third external electrodes in contact with the capacitor main body in the length direction is preferably smaller than the length of the uppermost surface of the external electrode in the length direction.

According to various preferred embodiments of the present invention, ceramic capacitors have low ESL and are suitable to be built into a substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
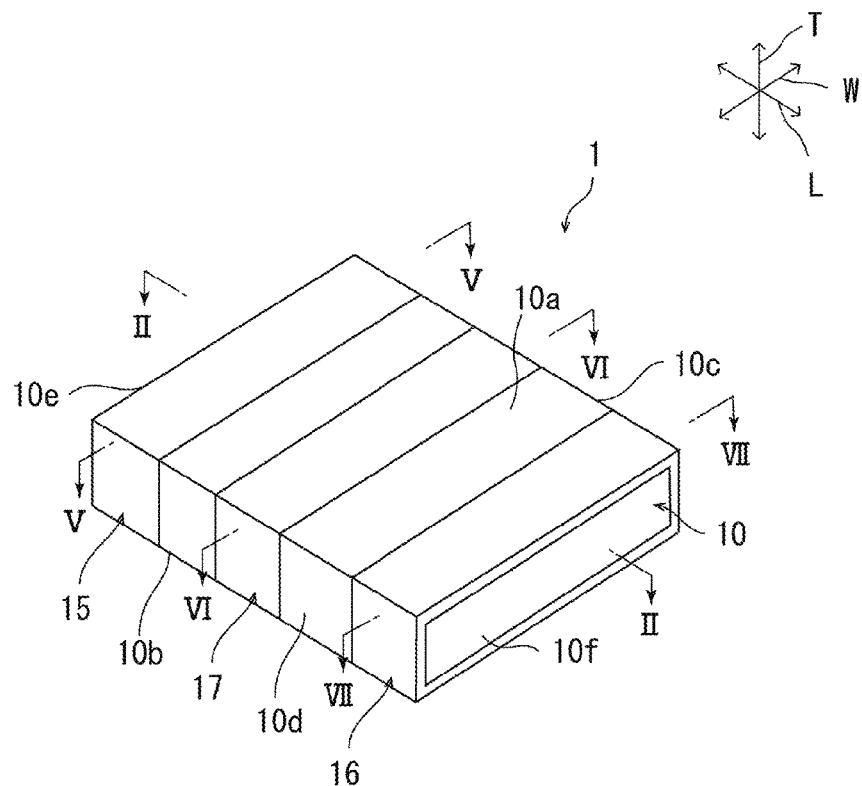
FIG. 1 is a schematic perspective view of a capacitor according to a preferred embodiment of the present invention.

Examples of preferred embodiments of the present invention will be described below. However, the following preferred embodiments are examples only. The present invention is not limited to the following preferred embodiments in any way.

In addition, members that have substantially the same functions shall be denoted by the same reference symbols in the respective drawings referred to in the preferred embodiments and the like. In addition, the drawings referred to in the preferred embodiments and the like are made in a schematic manner. The dimensional ratios and the like of objects presented in the drawings may differ from the dimensional ratios and the like of real objects. The dimensional ratios and the like of objects may also differ between the drawings. The dimensional ratios and the like of specific objects should be determined in view of the following description.

Figure 2:
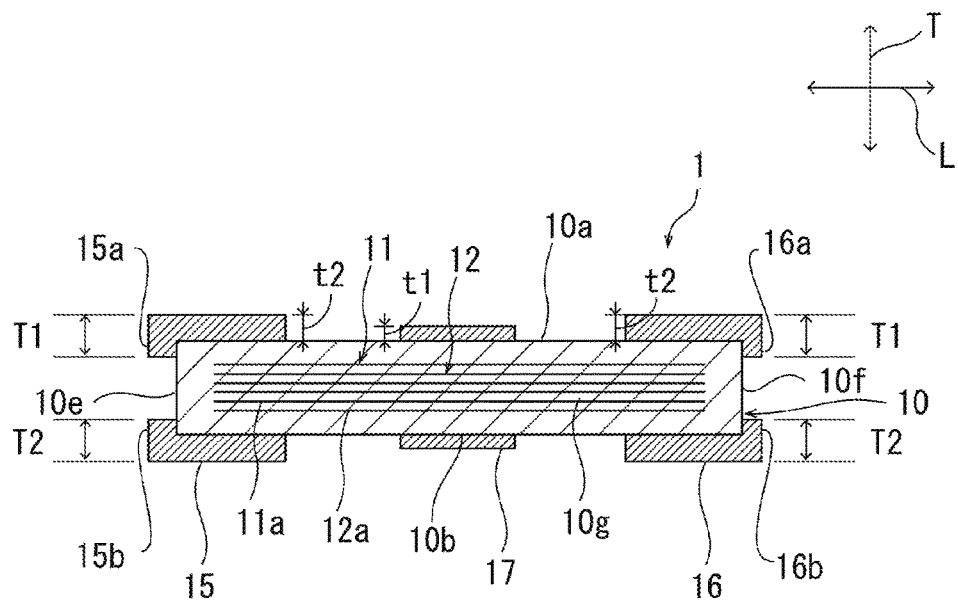
FIG. 2 is a schematic cross-sectional view of FIG. 1 along the line II-II.
Figure 3:
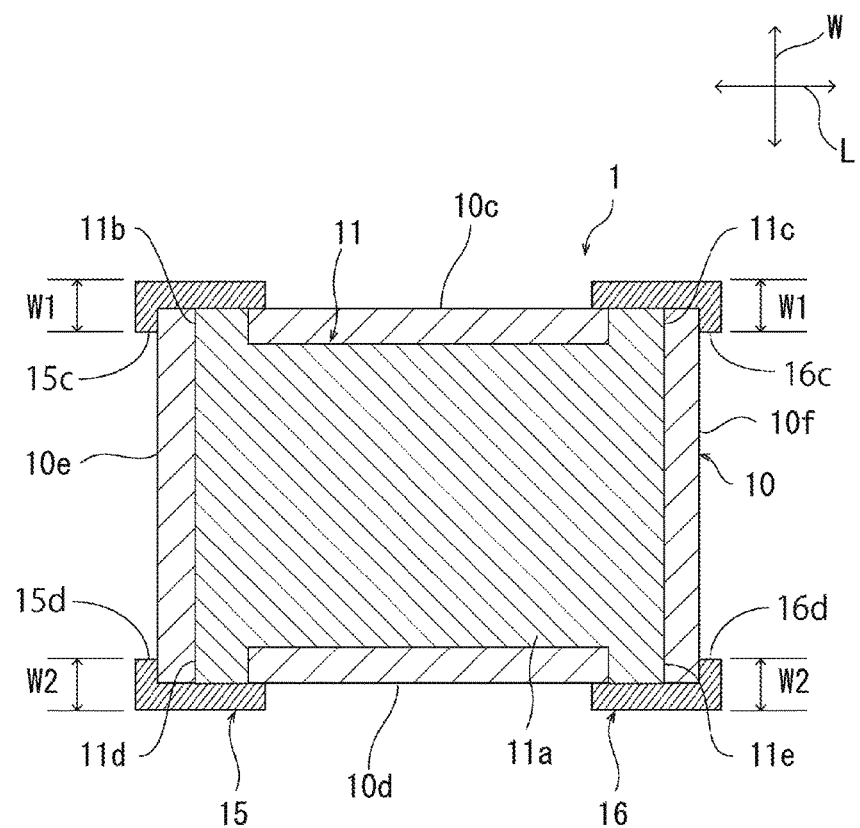
FIG. 3 is a schematic cross-sectional view of a capacitor according to a first preferred embodiment of the present invention.
Figure 4:
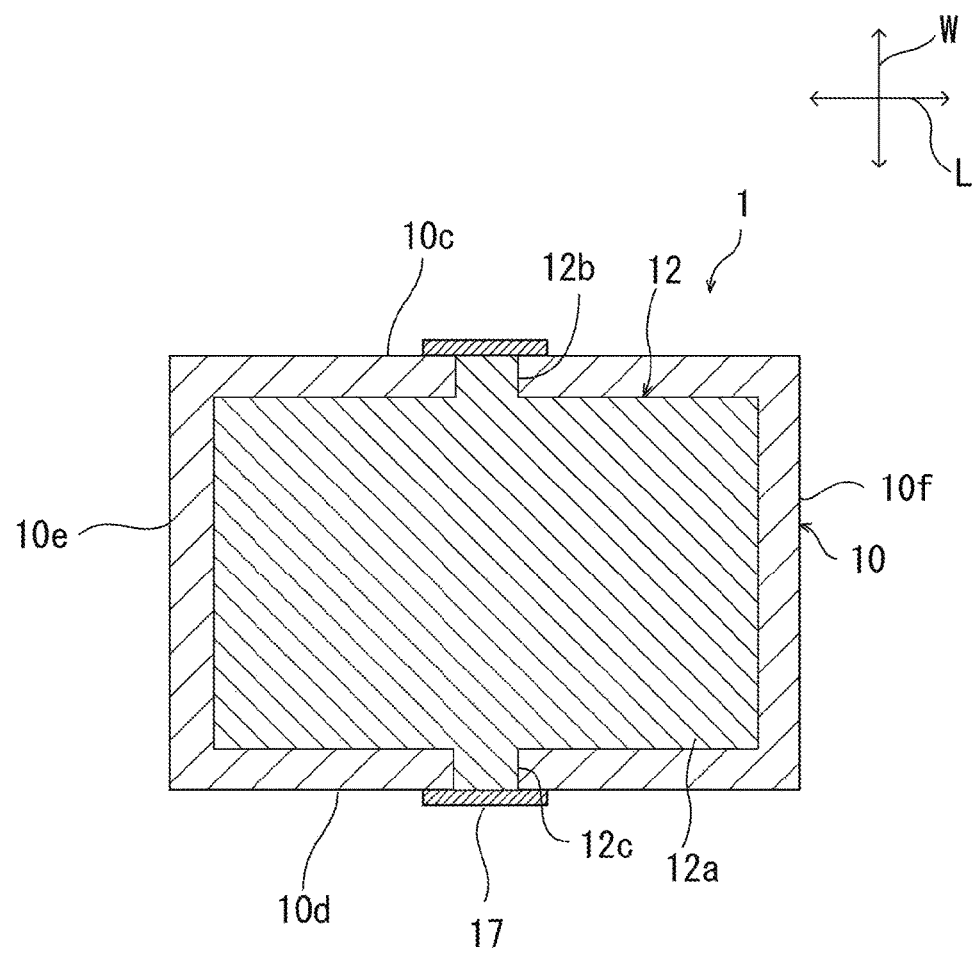
FIG. 4 is a schematic cross-sectional view of the capacitor according to the first preferred embodiment of the present invention.
Figure 5:
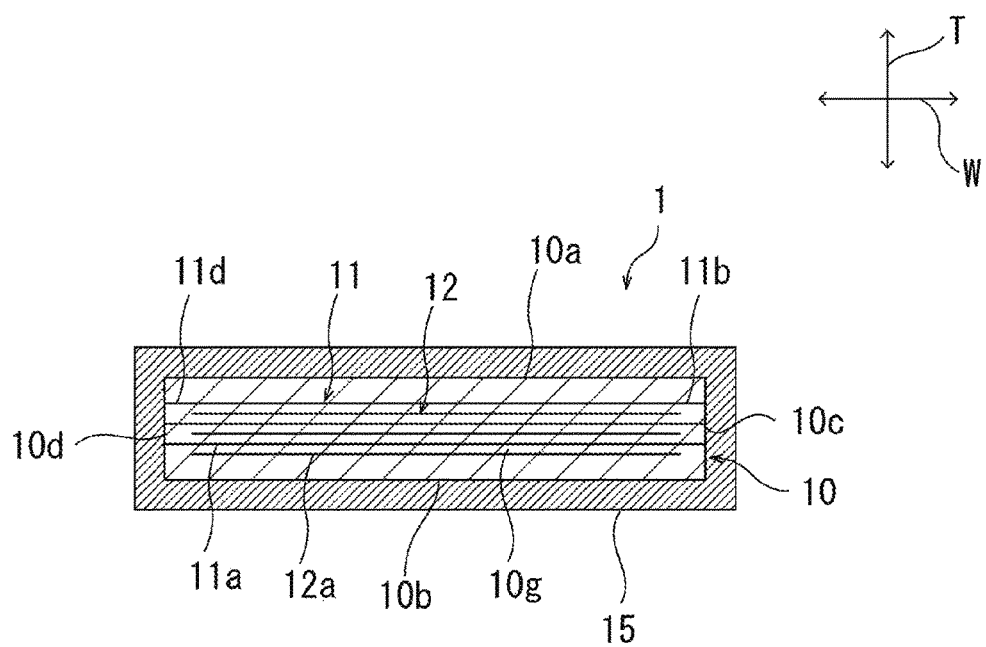
FIG. 5 is a schematic cross-sectional view of FIG. 1 along the line V-V.
Figure 6:
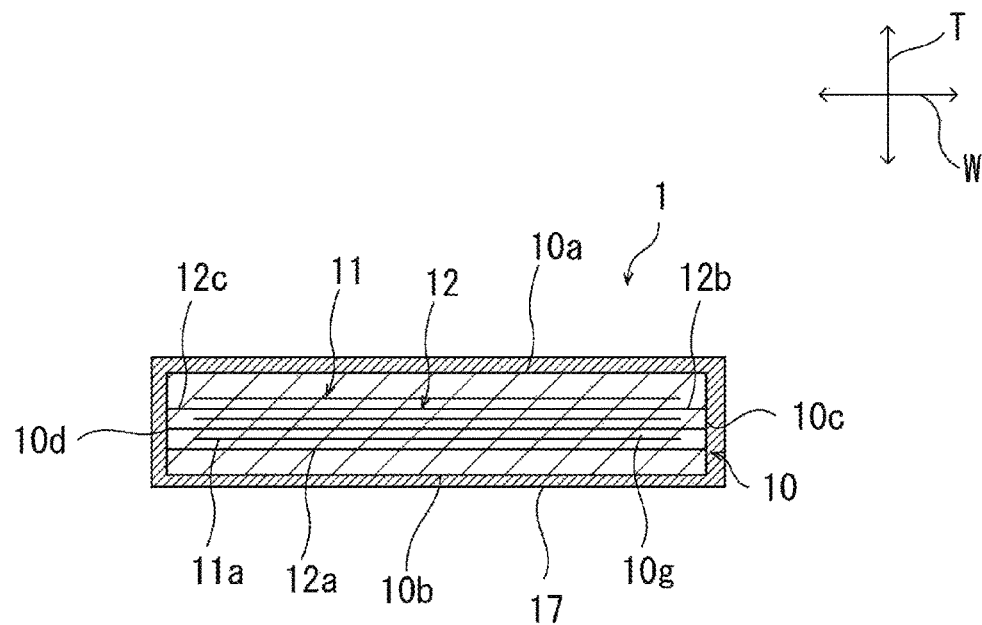
FIG. 6 is a schematic cross-sectional view of FIG. 1 along the line VI-VI.
Figure 7:
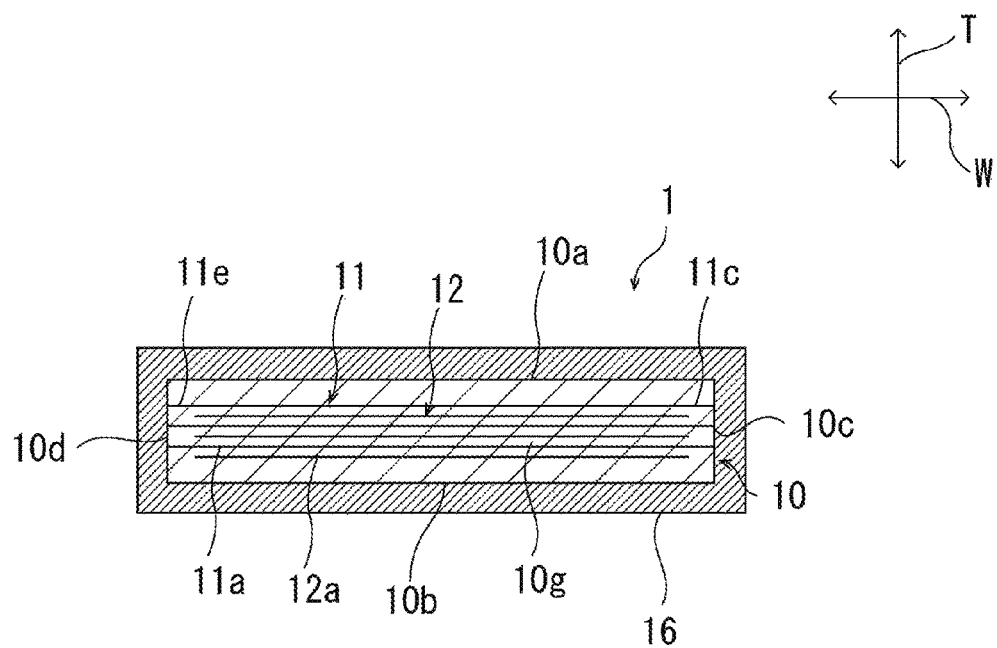
FIG. 7 is a schematic cross-sectional view of FIG. 1 along the line VII-VII.
Figure 8:
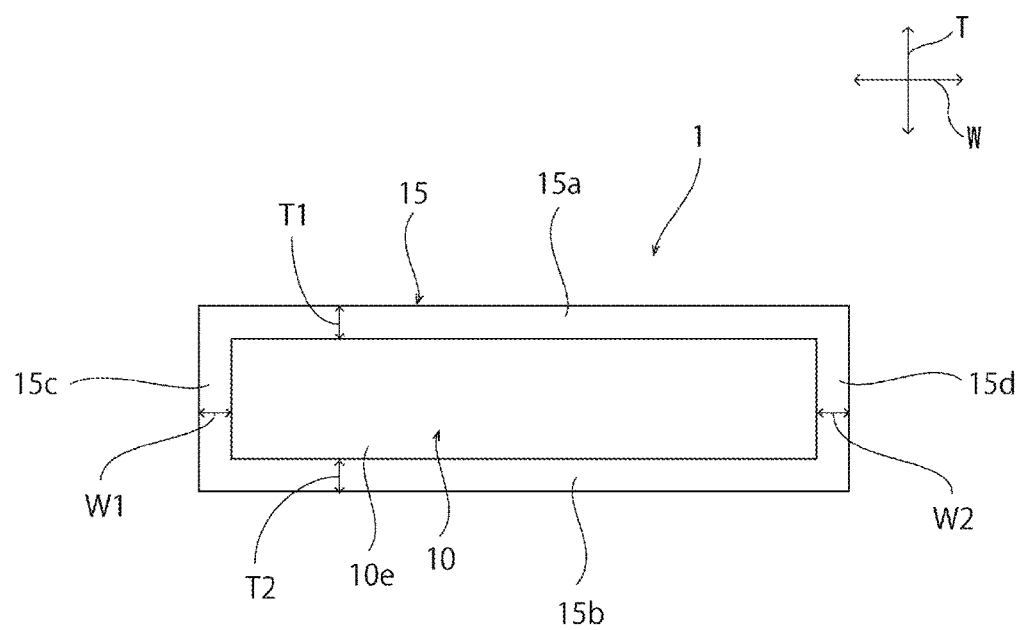
FIG. 8 is a schematic plan view of a first end surface of a capacitor according to a preferred embodiment of the present invention.
Figure 9:
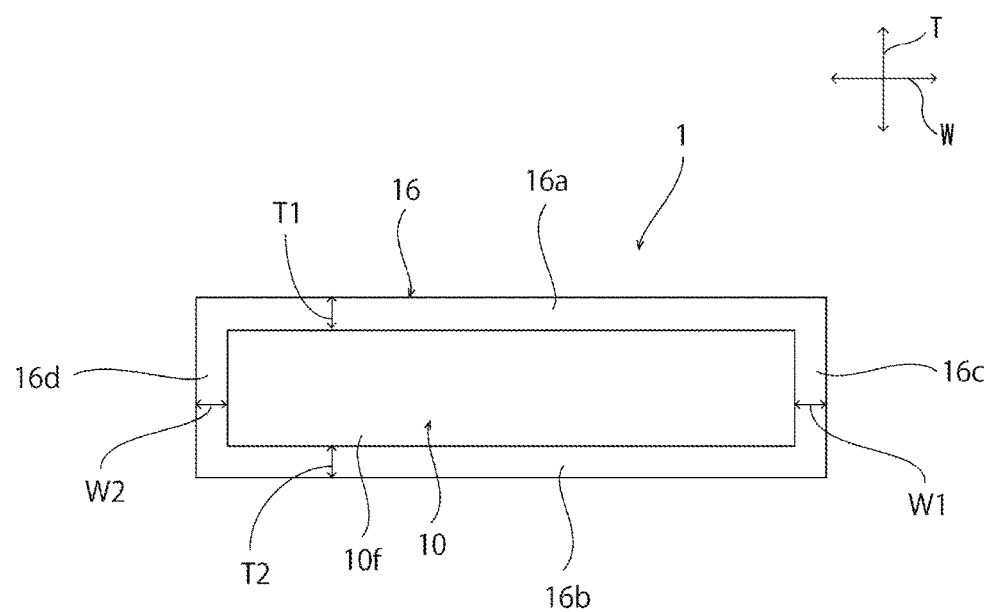
FIG. 9 is a schematic plan view of a second end surface of a capacitor according to a preferred embodiment of the present invention.

FIG. 1 is a schematic perspective view of a capacitor according to a first preferred embodiment of the present invention. FIG. 2 is a schematic cross-sectional view of FIG. 1 along the line II-II. FIG. 3 is a schematic cross-sectional view of a capacitor according to the first preferred embodiment in a length direction L and a width direction W. FIG. 4 is a schematic cross-sectional view of the capacitor according to the first preferred embodiment in the length direction L and the width direction W. It is to be noted that FIGS. 3 and 4 are schematic cross-sectional views of different sites that differ in the laminating direction T. FIG. 5 is a schematic cross-sectional view of FIG. 1 along the line V-V. FIG. 6 is a schematic cross-sectional view of FIG. 1 along the line VI-VI. FIG. 7 is a schematic cross-sectional view of FIG. 1 along the line VII-VII. FIG. 8 is a schematic plan view of a first end surface of the capacitor according to the present preferred embodiment. FIG. 9 is a schematic plan view of a second end surface of the capacitor according to the present preferred embodiment.

As shown in FIGS. 1 to 7, the ceramic capacitor 1 includes a capacitor main body 10. The capacitor main body 10 preferably has a cuboid or substantially cuboid shape. The capacitor main body 10 includes first and second principal surfaces 10a, 10b, first and second side surfaces 10c, 10d, and first and second end surfaces 10e, 10f. The first and second principal surfaces 10a, 10b each extend in the length direction L and the width direction W. The length direction L refers to a direction of connecting the first end surface 10e and the second end surface 10f. The width direction W is perpendicular or substantially perpendicular to the length direction L. The width direction W refers to a direction of connection the first side surface 10c and the second side surface 10d. The first and second side surfaces 10c, 10d each extend in the length direction L and the laminating direction T. The laminating direction T refers to a direction of connecting the first principal surface 10a and the second principal surface 10b. The laminating direction T is perpendicular or substantially perpendicular to each of the length direction L and the width direction W. The first and second end surfaces 10e, 10f each extend in the width direction W and the laminating direction T. The capacitor main body 10 may include ridges and corners chamfered or rounded, but preferably includes a rounded shape from the perspective of significantly reducing or preventing the generation of cracks.

The capacitor main body 10 can be made of, for example, an appropriate dielectric ceramic. The capacitor main body 10 may be specifically made of, for example, a dielectric ceramic containing $BaTiO_3$, $CaTiO_3$, $SrTiO_3$, $CaZrO_3$, or the like. The capacitor main body 10 may have a Mn compound, an Fe compound, a Cr compound, a Co compound, a Ni compound, and the like added thereto.

The dimensions of the capacitor main body 10 are not particularly limited, but when the height dimension, length dimension, and width dimension of the capacitor main body 10 are denoted respectively by DT, DL, and DW, it is preferable to meet the condition of DT<DW<DL, (about ½)DW≤DT≤(about ⅓)DW, or DT<about 0.25 mm, for example. Specifically, it is preferable to meet the conditions of about 0.05 mm DT≤about 0.25 mm, about 0.4 mm≤DL≤about 1 mm, and about 0.3 mm≤DW≤about 0.5 mm, for example. As just described, the ceramic capacitor 1 according to the present preferred embodiment is small in dimension in the laminating direction, and thus suitable to be built into a substrate. However, when the ceramic capacitor 1 is excessively small in dimension in the laminating direction, the capacitance of the ceramic capacitor 1 may be excessively low, or the strength of the ceramic capacitor 1 may be excessively low. Accordingly, the dimension of the ceramic capacitor 1 in the laminating direction is preferably about ⅕ times or more, more preferably about ½ times or more as large as the width dimension, for example.

It is to be noted that the respective dimensions of the ceramic capacitor 1 can be measured with the use of a micrometer or a microscope.

As shown in FIG. 2, a plurality of internal electrodes 11, 12 are provided inside the capacitor main body 10. Specifically, inside the capacitor main body 10, a plurality of first internal electrodes 11 and a plurality of second internal electrodes 12 are disposed alternately in the laminating direction T. The first internal electrode 11 and the second internal electrode 12 adjacent to each other in the laminating direction T are opposed with a ceramic portion 10g interposed therebetween. Thus, capacitance is generated. It is to be noted that the ceramic portion 10g is preferably, for example, about 0.5 μm or more and about 10 μm or less in thickness.

As shown in FIG. 3, the first internal electrode 11 is exposed at each of the first side surface 10c and the second side surface 10d. Specifically, the first internal electrode 11 includes an opposed portion 11a, a first extended portion 11b, a second extended portion 11c, a third extended portion 11d, and a fourth extended portion 11e.

The opposed portion 11a is opposed to the second internal electrode 12 in the laminating direction T. The opposed portion 11a preferably has a rectangular or substantially rectangular shape.

The first extended portion 11b is connected to the opposed portion 11a. The first extended portion 11b is extended to the first side surface 10c. Specifically, the first extended portion 11b extends from corners of the opposed portion 11a closer to the first side surface 10c and the first end surface 10e toward the first side surface 10c.

The second extended portion 11c is connected to the opposed portion 11a. The second extended portion 11c is extended to the first side surface 10c. Specifically, the second extended portion 11c extends from corners of the opposed portion 11a closer to the first side surface 10c and the second end surface 10f toward the first side surface 10c. The first extended portion 11b is connected to one end of the opposed portion 11a in the length direction L, whereas the second extended portion 11c is connected to the other end of the opposed portion 11a in the length direction L.

The third extended portion 11d is connected to the opposed portion 11a. The third extended portion 11d is extended to the second side surface 10d. Specifically, the third extended portion 11d extends from corners of the opposed portion 11a closer to the second side surface 10d and the first end surface 10e toward the second side surface 10d.

The fourth extended portion 11e is connected to the opposed portion 11a. The fourth extended portion 11e is extended to the second side surface 10d. Specifically, the fourth extended portion 11e extends from corners of the opposed portion 11a closer to the second side surface 10d and the second end surface 10f toward the second side surface 10d. The third extended portion 11d is connected to one end of the opposed portion 11a in the length direction L, whereas the fourth extended portion 11e is connected to the other end of the opposed portion 11a in the length direction L.

As shown in FIG. 4, the second internal electrode 12 is exposed at each of the first and second side surfaces 10c, 10d. Specifically, the second internal electrode 12 includes an opposed portion 12a, a fifth extended portion 12b, and a sixth extended portion 12c.

The opposed portion 12a is opposed to the opposed portion 11a of the first internal electrode 11 in the laminating direction T. The opposed portion 12a preferably has a rectangular or substantially rectangular shape.

The fifth extended portion 12b is connected to the opposed portion 12a. The fifth extended portion 12b is extended to the first side surface 10c. The fifth extended portion 12b is located between the first extended portion 11b and the second extended portion 11c in the length direction L. The fifth extended portion 12b extends substantially from the center of the opposed portion 12a toward the first side surface 10c in the length direction L.

The sixth extended portion 12c is connected to the opposed portion 12a. The sixth extended portion 12c is extended to the second side surface 10d. The sixth extended portion 12c is located between the third extended portion 11d and the fourth extended portion 11e in the length direction L. The sixth extended portion 12c extends substantially from the center of the opposed portion 12a toward the second side surface 10d in the length direction L.

It is to be noted that the extended portions 11b, 11c, 11d, 11e, 12b, 12c can be each, for example, about 50 μm or more and about 100 μm or less in width.

As described above, the extended portions 11b, 11c, 11d, 11e, 12b, 12c of the internal electrodes 11, 12 are all extended to the first and second side surfaces of the capacitor main body 10, thus making it possible to reduce the respective intervals between the extended portions 11b, 11c, 11d, 11e, of the first internal electrode 11 and the extended portions 12b, 12c of the second internal electrode 12. For this reason, the path length of a current flow is able to be reduced in the ceramic capacitor 1. Accordingly, the equivalent series inductance (ESL) of the ceramic capacitor 1 is able to be reduced.

The first and second internal electrodes 11, 12 can be, for example, about 0.2 μm or more and about 2 μm or less in thickness, for example.

The first and second internal electrodes 11, 12 can be made of appropriate conductive materials. The first and second internal electrodes can be made of, for example, metals such as Ni, Cu, Ag, Pd, and Au, and alloys containing one of these metals, such as Ag—Pd alloys.

As shown in FIG. 1, the ceramic capacitor 1 includes a plurality of external electrodes 15, 16, and 17. Specifically, the ceramic capacitor 1 includes the first internal electrode 15, the second external electrode 16, and the third external electrode 17.

The first external electrode 15 covers from an exposed portion of the first extended portion 11b of the first internal electrode 11 at the first side surface 10c and an exposed portion of the third extended portion 11d of the first internal electrode at the second side surface 10d, to the first and second principal surfaces 10a, 10b. Specifically, the first external electrode 15 covers the exposed portions of the first extended portion 11b and third extended portion 11d, and wraps around the first side surface 10c, the first principal surface 10a, the second side 10d, and second principal surface 10b. The first external electrode 15 is preferably about 190 μm or more and about 270 μm or less in width, for example.

The second external electrode 16 covers from an exposed portion of the second extended portion 11c of the first internal electrode 11 at the first side surface 10c and an exposed portion of the fourth extended portion 11e of the first internal electrode at the second side surface 10d, to the first and second principal surfaces 10a, 10b. Specifically, the second external electrode 16 covers the exposed portions of the second extended portion 11c and fourth extended portion 11e, and wraps around the first side surface 10c, the first principal surface 10a, the second side 10d, and second principal surface 10b. The second external electrode 16 is preferably about 190 μm or more and about 270 μm or less in width, for example.

The first external electrode 15 is provided on one end of the capacitor main body 10 in the length direction L, whereas the second external electrode 16 is provided on the other end of the capacitor main body 10 in the length direction L.

In the length direction L, the third external electrode 17 is provided between the first external electrode 15 and the second external electrode 16. The third external electrode 17 covers from an exposed portion of the fifth extended portion 12*b* of the second internal electrode 12 at the first side surface 10*c* and an exposed portion of the sixth extended portion 12*c* of the second internal electrode 12 at the second side surface 10*d*, to the first and second principal surfaces 10*a*, 10*b*. Specifically, the third external electrode 17 covers the exposed portions of the fifth extended portion 12*b* and sixth extended portion 12*c*, and wraps around the first side surface 10*c*, the first principal surface 10*a*, the second side 10*d*, and second principal surface 10*b*. The third external electrode 17 is preferably about 240 μm or more and about 320 μm or less in width, for example. The distance in the length direction L between the third external electrode 17 and the first or second external electrode 15, 16 is preferably about 70 μm or more, for example.

Figure 11:
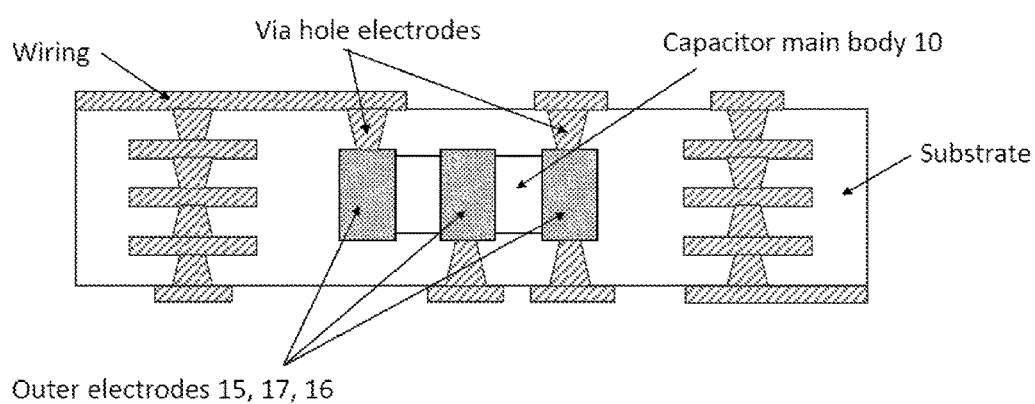
FIG. 11 is a schematic perspective view of a capacitor embedded in a substrate according to a preferred embodiment of the present invention.

As described above, the first to third external electrodes 15 to 17 each wrap around the capacitor main body 10, and thus, the areas of the external electrodes 15 to 17 are able to be ensured sufficiently, and via holes are able to be formed easily which lead to the external electrodes 15 to 17 of the ceramic capacitor 1 embedded in a substrate as shown in FIG. 11. In addition, it becomes possible to make a plurality of via hole electrodes electrically continuous to each of the external electrodes 15 to 17, and the wiring resistance from the substrate side to the ceramic capacitor 1 is thus reduced. Accordingly, it becomes possible to achieve further lowered ESL.

The first to third external electrodes 15 to 17 each include an outermost layer that is a Cu plated layer.

The first to third external electrodes 15 to 17 can be each made of, for example, a laminated body of a base electrode layer, a thin-film electrode layer, and a Cu plated layer.

The base electrode layer preferably contains at least one metal selected from the group consisting of, for example, Cu, Ni, Ag, Pd, an Ag—Pd alloy, and Au. The base electrode layer may be obtained by co-firing with the capacitor main body 10 including the internal electrodes 11, 12, or applying and baking a conductive paste after the capacitor main body 10 including the internal electrodes 11, 12 is subjected to firing. Alternatively, the base electrode layer may be formed by plating, or formed by curing a conductive resin including a thermosetting resin. The base electrode layer preferably further includes an inorganic binding material. The inorganic binding material increases the adhesion strength to the capacitor main body 10. When the base electrode layer is formed by co-firing with the capacitor main body 10 including the internal electrodes 11, 12, the inorganic bonding material is also referred to as a common material. In such a case, the inorganic binding material is preferably, for example, the same type of ceramic material as the ceramic material included in the capacitor main body 10. The inorganic binding material may be, for example, a ceramic material containing the same main constituent as that of the ceramic material included in the capacitor main body 10. Alternatively, the inorganic binding material of the base electrode layer may be, for example, a glass component.

The base electrode layer is provided on the exposed portions of the internal electrodes 11, 12 at the first and second side surfaces 10*c*, 10*d* of the capacitor main body 10. It is to be noted that the base electrode layer may extend not only on the exposed portions of the internal electrodes 11, 12 on the first and second side surfaces 10*c*, 10*d*, but also to ridges where the first and second principal surfaces 10*a*, 10*b* of the capacitor main body 10 intersect the first and second side surfaces 10*c*, 10*d* thereof, and may be provided partially on the principal surfaces 10*a*, 10*b* of the capacitor main body 10. According to the present preferred embodiment, the first external electrode 15 and the second external electrode 16 are not disposed on ridges where the first and second principal surfaces 10*a*, 10*b* intersect the first and second end surfaces 10*e*, 10*f*, or on the first and second end surfaces 10*e*, 10*f*. For this reason, the capacitor main body 10 which includes a high adhesion force to a resin of a substrate is able to be increased in surface area. Accordingly, the adhesion between the substrate and the ceramic capacitor 1 is able to be improved.

The maximum thickness of the base electrode layer is preferably about 1 μm or more, for example.

According to the present preferred embodiment, the thin-film electrode layer is provided on the base electrode layer and the first and second principal surfaces 10*a*, 10*b*. The thin-film electrode layer preferably contains at least one metal selected from the group consisting of, for example, Mg, Al, Ti, W, Cr, Cu, Ni, Ag, Co, Mo, and V. In this case, the fixing strength of the external electrodes 15 to 17 to the capacitor main body 10 is able to be increased. The thin-film electrode layer is preferably about 0.05 μm or more and about 1 μm or less in thickness, for example. The thin-film electrode layer may be a single layer, or a laminated body of a plurality of layers. The thin-film electrode layer can be formed by, for example, a sputtering method or the like. In other words, the thin-film electrode layer may be made of a sputtering film.

The Cu plated layer covers the base electrode layer and the thin-film electrode layer. The plated layer may be a single layer or a plurality of layers, and the outermost layer is the Cu plated layer. The outermost layer of the plated layer is the Cu plated layer, thus making it possible to build the ceramic capacitor 1 easily in a substrate to embed the ceramic capacitor into the substrate. In this regard, to embed the ceramic capacitor 1 into a substrate, there is a need to provide via holes for electronic component connection in order to make the capacitor electrically continuous to the external electrodes 15 to 17, and the via holes for electronic component connection are formed with the use of a laser such as a $CO_2$ laser. In the case of forming via holes with the use of a laser, the external electrodes 15 to 17 of the ceramic capacitor 1 will be irradiated directly with the laser. In this case, the outermost layers of the external electrodes 15 to 17 include the Cu plated film, thus making it possible to reflect the laser at a high reflectivity. Accordingly, the ceramic capacitor 1 where the outermost layers of the plated layers include the Cu plated layers can be used as a substrate-embedded type capacitor in a preferred manner. If the reflectivity of the external electrodes 15 to 17 is low with respect to the laser, the laser may go into the capacitor, thus damaging the capacitor.

The plated film is preferably about 1 μm or more and about 15 μm or less in thickness per layer, for example. Conductive resin layers for stress relaxation may be formed between the base electrode layers and the plated layers.

As shown in FIG. 2, according to the present preferred embodiment, the thickness t1 of a portion of the third external electrode 17 provided on the first or second principal surface 10*a*, 10*b* is smaller than the thicknesses t2 of portions of the first and second external electrodes 15, 16 provided on the first or second external electrode 10*a*, 10*b*. For this reason, in mounting the ceramic capacitor 1 onto a substrate, a mount nozzle of a surface mount machine is able to be prevented from coming into abutment with only the third external electrode 17, and is also brought into abutment with the first and second external electrodes 15, 16. For this reason, stress generated in adsorption with the mount nozzle is able to be dispersed. Accordingly, the capacitor main body 10 is prevented from having cracks and the like generated with ends of the external electrodes 15 to 17 as starting points. More specifically, the reliability of the ceramic capacitor 1 is improved.

From the perspective of preventing the capacitor main body 10 in a more effective manner from having cracks and the like generated with ends of the external electrodes 15 to 17 as starting points, the difference is preferably about 0.5 µm or more, for example, between the thickness t1 of a portion of the third external electrode 17 provided on the first or second principal surface 10a, 10b and the thicknesses t2 of portions of the first and second external electrodes 15, 16 provided on the first or second principal surface 10a, 10b.

As shown in FIGS. 2, 3, and 8, the first external electrode 15 extends over the first and second principal surfaces 10a, 10b and the first and second side surfaces 10c, 10d to a portion of the first end surface 10e. The first external electrode 15 includes a first portion 15a, a second portion 15b, a third portion 15c, and a fourth portion 15d.

The first portion 15a extends from a portion located on the first principal surface 10a to a portion of the first end surface 10e. For this reason, the first portion 15a covers a ridge of the capacitor main body 10, which is defined by the first principal surface 10a and the first end surface 10e.

The second portion 15b extends from a portion located on the second principal surface 10b to a portion of the first end surface 10e. For this reason, the second portion 15b covers a ridge of the capacitor main body 10, which is defined by the second principal surface 10b and the first end surface 10e. The second portion 15b is not directly connected to the first portion 15a. For this reason, the first end surface 10e is exposed between the first portion 15a and the second portion 15b.

The third portion 15c extends from a portion located on the first side surface 10c to a portion of the first end surface 10e. For this reason, the third portion 15c covers a ridge of the capacitor main body 10, which is defined by the first side surface 10c and the first end surface 10e.

The fourth portion 15d extends from a portion located on the second side surface 10d to a portion of the first end surface 10e. For this reason, the fourth portion 15d covers a ridge of the capacitor main body 10, which is defined by the second side surface 10d and the first end surface 10e. The fourth portion 15d is not directly connected to the third portion 15c. For this reason, the first end surface 10e is exposed between the third portion 15c and the fourth portion 15d.

As shown in FIGS. 2, 3, and 9, the second external electrode 16 extends over the first and second principal surfaces 10a, 10b and the first and second side surfaces 10c, 10d to a portion of the second end surface 10f. The second external electrode 16 includes a fifth portion 16a, a sixth portion 16b, a seventh portion 16c, and an eighth portion 16d.

The fifth portion 16a extends from a portion located on the first principal surface 10a to a portion of the second end surface 10f. For this reason, the fifth portion 16a covers a ridge of the capacitor main body 10, which is defined by the first principal surface 10a and the second end surface 10f.

The sixth portion 16b extends from a portion located on the second principal surface 10b to a portion of the second end surface 10f. For this reason, the sixth portion 16b covers a ridge of the capacitor main body 10, which is defined by the second principal surface 10b and the second end surface 10f. The sixth portion 16b is not directly connected to the fifth portion 16a. For this reason, the second end surface 10f is exposed between the fifth portion 16a and the sixth portion 16b.

The seventh portion 16c extends from a portion located on the first side surface 10c to a portion of the second end surface 10f. For this reason, the seventh portion 16c covers a ridge of the capacitor main body 10, which is defined by the first side surface 10c and the second end surface 10f.

The eighth portion 16d extends from a portion located on the second side surface 10d to a portion of the second end surface 10f. For this reason, the eighth portion 16d covers a ridge of the capacitor main body 10, which is defined by the second side surface 10d and the second end surface 10f. The eighth portion 16d is not directly connected to the seventh portion 16c. For this reason, the second end surface 10f is exposed between the seventh portion 16c and the eighth portion 16d.

As described above, the first to fourth portions 15a to 15d of the first external electrode 15 cover the ridges defined by the first end surface 10e of the capacitor main body 10 and each of the first and second principal surfaces 10a, 10b and first and second side surfaces 10c, 10d. The fifth to eighth portions 16a to 16d of the second external electrode 16 cover the ridges defined by the second end surface 10f of the capacitor main body 10 and each of the first and second principal surfaces 10a, 10b and first and second side surfaces 10c, 10d. Accordingly, the ridges of the capacitor main body 10 are protected with the first and second external electrodes 15, 16. Therefore, even when shocks and stress are applied to the ceramic capacitor 1 from the outside, the capacitor main body 10 is less likely to undergo breakdown. Accordingly, the ceramic capacitor 1 includes excellent reliability.

In the case of the ceramic capacitor 1, the first end surface 10e is not entirely covered with the first external electrode 15, whereas the second end surface 10f is not entirely covered with the second external electrode 16. In other words, as described above, the first end surface 10e is exposed between the first portion 15a and the second portion 15b, and partially exposed between the third portion 15c and the fourth portion 15d. In addition, the second end surface 10f is exposed between the fifth portion 16a and the sixth portion 16b, and partially exposed between the seventh portion 16c and the eighth portion 16d. Therefore, the surface of capacitor main body 10 is able to be exposed which includes a higher adhesion force to a substrate than the surfaces of the external electrodes 15, 16. For this reason, when the ceramic capacitor 1 is built in a substrate, the adhesion strength between the ceramic capacitor 1 and the substrate is able to be increased. Accordingly, ingress of water and the like into the built-in capacitor substrate is significantly reduced or prevented. Therefore, the ceramic capacitor 1 has, even when built in a substrate, excellent reliability.

In the case of the ceramic capacitor 1, the lengths of the first and second portions 15a, 15b of the first external electrode 15, and of the fifth and sixth portions 16a, 16b of the second external electrode 16 in the laminating direction T are each about 5% or more and about 15% or less of the dimension of the ceramic capacitor 1 in the laminating direction T, for example. The lengths of the third and fourth portions 15c, 15d of the first external electrode 15, and of the seventh and eighth portions 16c, 16d of the second external electrode 16 in the laminating direction T are each about 5% or more and about 15% or less of the width dimension of the ceramic capacitor 1, for example. For this reason, the surface of the capacitor main body 10 which includes a higher adhesion force to the substrate than the surfaces of the external electrodes 15, 16 is able to be exposed in a preferred range. For this reason, when the ceramic capacitor 1 is built into a substrate, the adhesion thereof to the substrate is able to be improved. In addition, the ridges of the capacitor main body 10 are able to be protected with the external electrodes 15, 16, and the ceramic capacitor 1 is less likely to be broken or cracked. Furthermore, the lengths of the third and fourth portions 15c, 15d of the first external electrode 15, and of the seventh and eighth portions 16c, 16d of the second external electrode 16 are adapted to fall within appropriate ranges, thus making it also possible to control the dimensions of the external electrodes 15, 16 in the length direction L of the ceramic capacitor 1. For this reason, multilayer ceramic capacitor 1 is unlikely to be defectively inserted into a cavity of a substrate on which the capacitor is to be mounted, and errors are unlikely to be caused in mounting the ceramic capacitor 1.

In addition, in the case of the ceramic capacitor 1, the lengths of the first and second portions 15a, 15b of the first external electrode 15, and of the fifth and sixth portions 16a, 16b of the second external electrode 16 in the laminating direction T are each preferably about 8% or more and about 12% or less of the dimension of the ceramic capacitor 1 in the laminating direction T, for example. The adoption of the percentage makes the advantageous effects described above more significant.

Figure 10:
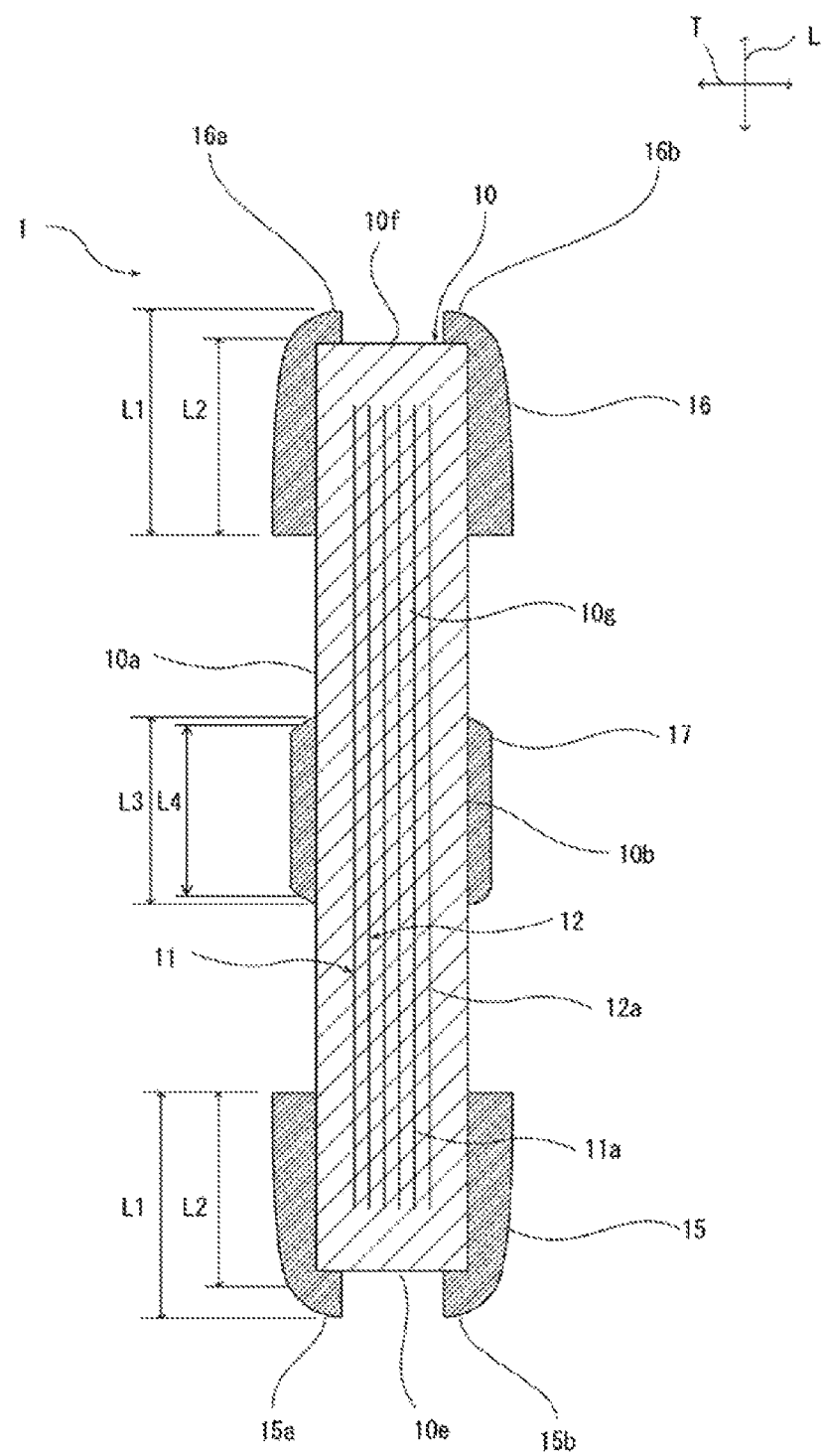
FIG. 10 is a schematic plan view of a capacitor according to a preferred embodiment of the present invention.

As shown in FIG. 10, when the maximum length in the length direction L, of portions of the first and second external electrodes 15, 16 located on the first or second principal surface 10a, 10b, is denoted by L1, whereas the maximum length of the first and second external electrodes 15, 16 in the length direction L from a portion farthest from the capacitor main body 10 in the laminating direction T, of the portions of the first and second external electrodes 15, 16 located on the first or second principal surface 10a, 10b, to a portion retreated to the capacitor main body 10 by about 40% of the thickness of the first or second external electrode 15, 16 in the laminating direction T is denoted by L2, the ratio L2/L1 is preferably about 80% or more and 90% or less, for example.

According to this configuration, the shocks applied to the ridges of the ceramic capacitor 1 are diffused effectively in mounting the ceramic capacitor 1 onto a substrate, and breakages and cracks thus are significantly reduced or prevented in the case of mounting the ceramic capacitor 1. In addition, the surface areas of flat portions of the first and second external electrodes 15, 16 are able to be increased, and excellent electrical connection is thus achieved between via hole electrodes and the first and second external electrodes 15, 16.

It is to be noted that while the advantageous effect is achieved by adjusting the ratio L2/L1 to about 80% or more and 90% or less for any one of the first external electrode and second external electrode, the effect is achieved more by adjusting the ratio L2/L1 to about 80% or more and 90% or less for both of the first external electrode and the second external electrode, for example.

When the maximum length in the length direction L, of a portion of the third external electrode 17 located on the first or second principal surface 10a, 10b, is denoted by L3, whereas the maximum length in the length direction L from a portion farthest from the capacitor main body 10 in the laminating direction T, of the a portion of the third external electrode 17 located on the first or second principal surface 10a, 10b, to a portion closer to the capacitor main body 10 by about 40% of the thickness of the third external electrode 17 in the laminating direction T is denoted by L4, the ratio L4/L3 is preferably about 80% or more, for example.

According to this configuration, the surface areas of flat portions of the first and second external electrodes 15, 16 are able to be increased, and excellent electrical connection is thus achieved between via hole electrodes and the first and second external electrodes 15, 16.

When the lengths of portions of the third external electrode 17 located on the first and second principal surfaces 10a, 10b in the length direction L are denoted by L5, whereas the lengths of portions of the third external electrode 17 located on the first and second side surfaces 10c, 10d in the length direction L are denoted by L6, it is preferable to meet the condition of L5>L6. According to this configuration, the areas of the portions of the third external electrode 17 located on the first and second principal surfaces 10a, 10b are able to be increased. For this reason, the area is able to be increased which can be irradiated with laser light to form a via hole leading to the third external electrode 17 of the ceramic capacitor 1 in a substrate with the ceramic capacitor 1 embedded therein. Accordingly, defective connection is able to be suppressed between the via hole electrode and the ceramic capacitor 1. In addition, the degree of freedom is improved for the location of the via hole electrode.

In the case of the ceramic capacitor 1, it is preferable that the width dimensions of portions of the external electrodes 15, 16 located on the principal surfaces 10a, 10b are smaller than the width dimensions of portions of the external electrodes 15, 16 located on the side surfaces 10c, 10d. According to this configuration, the exposed portions of the capacitor main body 10, which have high adhesion to the substrate, are able to be increased in area. Therefore, the adhesion is able to be improved between the ceramic capacitor 1 and the substrate. Therefore, the ceramic capacitor 1 and the substrate are kept from being separated from each other, which would cause ingress of water and the like from the separated portion. As a result, short circuits due to migration are significantly reduced or prevented between the first external electrode 15 and the second external electrode 16.

When the lengths of portions of the first and second external electrodes 15, 16 located on the first and second principal surfaces 10a, 10b in the length direction L are denoted by L7, whereas the lengths of portions of the first and second external electrodes 15, 16 located on the first and second side surfaces 10c, 10d in the length direction L are denoted by L8, it is preferable to meet the condition of L7>L8. According to this configuration, the areas of the portions of the first and second external electrodes 15, 16 located on the first and second principal surfaces 10a, 10b are able to be increased. For this reason, the area is able to be increased which can be irradiated with laser light to form via holes leading to the first and second external electrodes 15, 16 of the ceramic capacitor 1 in a substrate with the ceramic capacitor 1 built therein. Accordingly, defective connection is significantly reduced or prevented between the via hole electrode and the ceramic capacitor 1. In addition, the degree of freedom is able to be improved for the location of the via hole electrodes. In addition, the portions of the first and second external electrodes 15, 16 located on the first and second side surfaces 10c, 10d are smaller in width than the portions of the first and second external electrodes 15, 16 located on the first and second principal surfaces 10a, 10b, and the capacitor main body 10 which includes high adhesion to a substrate are able to be increased in exposed portion area. For this reason, the adhesion is able to be improved between the ceramic capacitor 1 and the substrate. Therefore, the ceramic capacitor 1 and the substrate are kept from being separated from each other, which would cause ingress of water and the like from the separated portion. As a result, short circuits due to migration are able to be significantly reduced or prevented between the first external electrode 15 and the second external electrode 16.

It is to be noted that when the lengths L of the portions of the third external electrode 17 located on the first and second principal surfaces 10a, 10b in the length direction L are denoted by L5, whereas the lengths L of the portions of the third external electrode 17 located on the first and second side surfaces 10c, 10d in the length direction L are denoted by L6, the ratio of L6/L5 is preferably about 0.77 or more and about 0.96 or less, for example. When the lengths L of the portions of the first and second external electrodes 15, 16 located on the first and second principal surfaces 10a, 10b in the length direction L are denoted by L7, whereas the lengths L of the portions of the first and second external electrodes 15, 16 located on the first and second side surfaces 10c, 10d in the length direction L are denoted by L8, the ratio of L8/L7 is preferably about 0.78 or more and about 0.96 or less, for example. According to this configuration, the advantageous effects described above are able to be achieved in a more effective manner.

The portion of the third external electrode 17 located on the first or second principal surface 10a, 10b is preferably smaller in thickness than the portions of the first and second external electrodes 15, 16 located on the first or second principal surface 10a, 10b. According to this configuration, in mounting the ceramic capacitor 1 onto a substrate, a mount nozzle of a surface mount machine is able to be prevented from coming into abutment with only the third external electrode 17 located in the center in the length direction L, and is able to be also brought into abutment with the first and second external electrodes 15, 16 on both sides of the third external electrode, thus dispersing stress. For this reason, the capacitor main body 10 is able to be prevented from having cracks generated with the external electrodes 15 to 17 as starting points.

From the perspective of preventing the capacitor main body 10 in a more effective manner from having cracks generated, the difference in thickness is preferably about 0.5 μm or more and about 15 μm or less between the portion of the third external electrode 17 located on the first or second principal surface 10a, 10b and the portions of the first and second external electrodes 15, 16 located on the first or second principal surface 10a, 10b, for example.

When the dimension of a portion of the third external electrode 17 in contact with the capacitor main body 10 in the length direction L is denoted by L9, whereas the dimension of an uppermost surface of the third external electrode 17 in the length direction L is denoted by L10, it is preferable to meet the condition of L9<L10. According to this configuration, an anchor effect is produced between the third external electrode 17 and a substrate, and the adhesion strength is able to be improved between the substrate and the ceramic capacitor 1. In addition, satisfying the condition of L9<L10 reduces the distance between the first external electrode 15 and the third external electrode 17 and the distance between the second external electrode 16 and the third external electrode 17. Therefore, it becomes possible to keep ion migration from being caused. From the same perspective, the dimension of a portion of the first external electrode 15 in contact with the capacitor main body 10 in the length direction L is preferably smaller than the dimension of an uppermost surface of the first external electrode 15 in the length direction L. The dimension of a portion of the second external electrode 16 in contact with the capacitor main body 10 in the length direction L is preferably smaller than the dimension of uppermost surface of the second external electrode 16 in the length direction L.

It is to be noted that the respective cross-sectional shapes of the external electrodes 15 to 17 are preferably tapered shapes that increases in width with distance from the capacitor main body 10. The adoption of the shape makes the advantageous effects described above more significant.

Method for Manufacturing Ceramic Capacitor

Next, an example of a method for manufacturing the ceramic capacitor 1 will be described.

First, ceramic green sheets, a conductive paste for internal electrodes, and a conductive paste for external terminal electrodes are prepared. The ceramic green sheets and the conductive pastes may contain a binder and a solvent. For the binder and solvent for use in the ceramic green sheets and the conductive pastes, for example, known binders and solvents can be used.

Next, onto the ceramic green sheets, the conductive paste is applied in predetermined patterns by, for example, a screen printing method or a gravure printing method, thus forming internal electrode patterns.

Next, the ceramic green sheets for outer layers without any internal electrode pattern applied by printing are laminated to reach a predetermined number of sheets, the ceramic green sheets with the internal electrode patterns applied by printing are sequentially stacked thereon, and the ceramic green sheets for outer layers are laminated thereon to reach a predetermined number of sheets, thus preparing a mother laminated body. Thereafter, the mother laminated body is subjected to pressing in the laminating direction by isostatic pressing, for example.

Next, the mother laminated body is cut into a predetermined size, thus cutting out a raw ceramic laminated body. In this regard, the raw ceramic laminated body may have corners and ridges rounded by barrel polishing or the like.

The base electrode paste is applied onto exposed portions of internal electrodes, which are exposed at side surfaces of the raw ceramic laminated body obtained by cutting into the predetermined size. The method for applying the base electrode paste is not limited. Examples of the method for applying the base electrode paste include, for example, a roller transfer method. Base electrode layers are formed by the roller transfer method, for example, the press pressure of a roller is controlled, thus making it possible to form the layers only on the side surfaces of the laminated body, or also on corners or ridges of the laminated body, and partially on principal surfaces of the laminated body.

It is to be noted that the roller transfer method preferably is the following method. The application roller for the roller transfer method may be made of an elastic body, or made of a metal. The peripheral surface of the application roller includes grooves. The grooves of the application roller are filled with the base electrode paste, and the application roller in abutment with a chip side surface is moved on surface to transfer the base electrode paste to the chip side surface. It is to be noted that the raw ceramic laminated body may be moved in the roller rotation direction so as to be synchronized with the rotation of the roller, thus transferring the paste. In addition, after the transfer, a roller filled with no base electrode paste may be pressed against the chip end surface to remove the excessively transferred conductive paste.

Next, the raw ceramic laminated body is subjected to firing, thus providing the capacitor main body 10. The firing temperature is preferably, for example, about 900° C. or higher and about 1300° C. or lower, for example, depending on the ceramic material and conductive material used. Thereafter, the capacitor main body 10 may be subjected to barrel polishing or the like, thus causing the capacitor main body 10 to include rounded ridges and corners.

Next, thereafter, thin-film electrode layers are formed. First, for the thin-film electrode layers, the fired capacitor main body 10 with the base electrode layers formed is inserted in a dedicated mask jig. This mask jig is configured to be capable of exposing only regions where the thin-film electrode layers are required to be formed. Then, with the exposure of only regions of the principal surfaces of the capacitor main body 10 where external electrodes are required to be formed, the capacitor main body 10 is supplied to sputtering equipment, thus forming, by a sputtering method or the like, the thin-film electrode layers on the predetermined regions of the principal surfaces of the capacitor main body 10. For example, the thin-film electrode layers (thin-film electrode layers in contact with the capacitor main body 10) are formed which have, for example, two layers of a NiCr film and a NiCu film.

Next, plated layers are formed on the thin-film electrode layers, thus completing the external electrodes 15 to 17. The plated layers may each include a single layer or a plurality of layers, but include an outermost layer made of a Cu plated layer. The plated layers may be formed by, for example, an electrolytic plating method, an electroless plating method, or the like.

In the case of forming the plated layers by an electrolytic plating method, specifically, a plating bath filled with a plating solution, and a cathode electrode and an anode electrode are prepared. In the plating solution, a plating voltage is applied between the cathode electrode and the anode electrode, thus applying a current in such way that the cathode electrode is brought into contact with the sintered electrode layer formed on the capacitor main body 10. Thus, a plated layer is deposited on the sintered electrode layer. It is to be noted that conductive media may be put in the plating solution along with the capacitor main body 10, thus applying a current to the sintered electrode layer of the capacitor main body 10 through the conductive media. It is to be noted that, for example, a vibration plating method of carrying out plating by stirring the capacitor main body 10 and conductive media with vibrations, a rotation barrel plating method of carrying out plating while rotationally stirring conductive media and the capacitor main body 10 put in a barrel, a centrifugal plating method of carrying out plating by stirring the capacitor main body 10 with the centrifugal force of a barrel, or the like is preferably used as the method for applying a current to the fired electrode layer.

Furthermore, if necessary, a heat treatment and a surface treatment for the external electrodes are carried out. The heat treatment densifies the external electrodes 15 to 17, thus improving the reliability. In addition, the surfaces of the external electrodes 15 to 17 are able to be made rough by applying the surface treatment to the surfaces of the external electrodes 15 to 17, and in the case of embedding into a substrate for built-in components, the adhesion is improved between the resin of the substrate and the external electrodes 15 to 17.

The ceramic capacitor 1 can be manufactured through the foregoing steps.

Preferred embodiments of the present invention will be described in more detail below with reference to specific examples, but the present invention is not to be considered limited to the following examples in any way, and appropriate modifications can be made in the practice of the invention without departing from the scope of the invention.

Example 1

With the use of the manufacturing method described with reference to the first preferred embodiment, 1000 capacitors configured in substantially the same fashion as the ceramic capacitors 1 according to the first preferred embodiment were prepared under the following conditions.

Conditions:

Dimensions of Ceramic Capacitor (Standard Dimension): L×W×T=1.000 mm×0.600 mm×0.220 mm Ceramic Material: $BaTi_2O_3$ Capacitance: 1 µF Rated Voltage: 6.3 V Structure of External Electrode: Base Electrode Layer/Thin Film Electrode Layer/Plated Layer Base Electrode Layer: Ni Fired Electrode Layer Thin Film Electrode Layer: NiCr Sputtered Film/NiCu Sputtered Film Plated Layer: Single Cu Plated Layer Thickness of Base Electrode Layer (Central portion): 6 µm Thickness of Thin Film Electrode Layer (Central portion): 0.3 µm in total (0.15 µm for each layer)

Thickness of Plated Layer (Central portion): 10 µm

Lengths of First, Second, Fifth, and Sixth portions in Thickness Direction: 11 µm Lengths of Third, Fourth, Seventh, and Eighth portions in Width Direction: 30 µm Comparative Example 1

As Comparative Example 1, ceramic capacitors were prepared where extended portions of first internal electrodes were extended only to respective end surfaces, and first and second external electrodes cover the entire end surfaces of capacitor main bodies. It is to be noted that the external electrodes were each made of a laminated body of: a base electrode of a Ni fired electrode layer; and a single Cu plated layer formed thereon. In the same way as Example 1 except for the foregoing, 1000 samples were prepared.

Evaluation of Adhesion

The ceramic capacitors prepared according to Example 1 and Comparative Example 1 were built in substrates, thus preparing built-in ceramic capacitor substrates. Next, the ceramic capacitor built-in substrates were polished parallel to side surfaces of the ceramic capacitors until the dimensions of the ceramic capacitors in the width direction reached about ½ thereof, thus exposing cross sections.

Next, in the cross sections, whether the substrate and the ceramic capacitor were brought into close contact with each other or not were observed with the use of a metallograph, and the numbers of defective products was counted when the sample where the substrate and the ceramic capacitor were not brought into close contact with each other was regarded as a defective product. The results are shown in Table 1.

TABLE 1

| | Number of Defective Products/Number of Samples |
|---|---|
| Example 1 | 0/1000 |
| Comparative Example 1 | 7/1000 |

Experimental Examples

With the use of the manufacturing method described with reference to the first preferred embodiment, 1000 capacitors configured in substantially the same fashion as the ceramic capacitors 1 according to the first preferred embodiment were prepared for each example under the conditions shown in Table 2, and evaluated for adhesion, subjected to calculation of incidence of breakage/crack, and evaluated for mountability.

Evaluation of Adhesion

The ceramic capacitors prepared according to each experimental example were evaluated for adhesion in the same way as the evaluation method mentioned above. The results are shown in Tables 2 to 11.

Incidence of Breakage/Crack

First and second end surfaces of the ceramic capacitors prepared according to each experimental example were observed with the use of a metallograph, and the number of defective products was counted when the sample broken or cracked was regarded as a defective product. The results are shown in Tables 2 to 11.

Evaluation of Mountability

The ceramic capacitors were mounted in cavities of substrates for built-in ceramic capacitors with the use of a surface mount machine, and the number of defective products was counted when the ceramic capacitor which failed to be mounted was regarded as a defective product. SIGMA-G: Hitachi High-Technologies Corporation was used as the surface mount machine. The size of the cavity was adjusted to L×W=1.080 mm×0.670 mm. The results are shown in Tables 2 to 11.

Method for Measuring Lengths of First to Eighth Portions

The lengths of the first to fourth portions were obtained by observing the ceramic capacitors with the use of a metallograph from the first side surfaces, and measuring the lengths of the longest portions.

The lengths of the fifth to eighth portions were obtained by observing the ceramic capacitors with the use of a metallograph from the second side surfaces, and measuring the lengths of the longest portions.

The symbols in Tables 2 to 11 below meanings as follows:

T1: The lengths of the first and fifth portions in the laminating direction T, which is, specifically, the maximum lengths (μm) in the laminating direction T from the surfaces of portions of the first and second external electrodes located on the first and second principal surfaces to ends of portions of the first and second external electrodes located on the first and second end surfaces.

T2: The lengths of the second and sixth portions in the laminating direction T, which is, specifically, the maximum lengths (μm) in the laminating direction T from the surfaces of portions of the first and second external electrodes located on the first and second principal surfaces to ends of portions of the first and second external electrodes located on the first and second end surfaces.

T: The length of the ceramic capacitor in the laminating direction T (μm)

W1: The lengths of the third and seventh portions in the width direction W, which is, specifically, the maximum lengths (μm) in the length direction L from the surfaces of portions of the first and second external electrodes located on the first and second side surfaces to ends of portions of the first and second external electrodes located on the first and second end surfaces.

W2: The lengths of the fourth and eighth portions in the width direction W, which is, specifically, the maximum lengths (μm) in the length direction L from the surfaces of portions of the first and second external electrodes located on the first and second side surfaces to ends of portions of the first and second external electrodes located on the first and second end surfaces.

W: The length of the ceramic capacitor in the width direction W (μm)

S1: The area of a portion exposed from the first or second external electrode for each of the first and second end surface (mm²)

S2: The area of a portion covered with the first or second external electrode for each of the first and second end surface (mm²)

L1: The thicknesses of the first to eighth portions in the length direction L (μm)

It is to be noted that the T1, T2, T, W1, W2, W, S1, S2, and L were measured in the following manner.

Method for Measuring T1

As for the T1, the ceramic capacitors were observed from the first and second end surfaces with the use of a metallograph, and the maximum lengths in the thickness direction T were each measured from the surfaces of portions of the first and second external electrodes formed on the first principal surfaces to ends of portions of the first and second external electrodes located on the first and second end surfaces. According to the examples, the capacitors are formed such that the length of the first portion and the length of the fifth portion are equal to each other.

Method for Measuring T2

As for the T2, the ceramic capacitors were observed from the first and second end surfaces with the use of a metallograph, and the maximum lengths were measured from the surfaces of portions of the first and second external electrodes formed on the second principal surfaces to ends of portions of the first and second external electrodes located on the first and second end surfaces. According to the examples, the capacitors are formed such that the length of the second portion and the length of the sixth portion are equal to each other.

Method for Measuring T

As for the T, the lengths of the ceramic capacitors in the thickness direction T were measured with the use of a microscope.

Method for Measuring W1

As for the W1, the ceramic capacitors were observed from the first and second end surfaces with the use of a metallograph, and the maximum lengths were measured from the surfaces of portions of the first and second external electrodes located on the first side surfaces to ends of portions of the first and second external electrodes located on the first and second end surfaces. According to the examples, the capacitors are formed such that the length of the third portion and the length of the seventh portion are equal to each other.

Method for Measuring W2

As for the W2, the ceramic capacitors were observed from the first and second end surfaces with the use of a metallograph, and the maximum lengths were measured from the surfaces of portions of the first and second external electrodes located on the second side surfaces to ends of portions of the first and second external electrodes located on the first and second end surfaces. According to the examples, the capacitors are formed such that the length of the fourth portion and the length of the eighth portion are equal to each other.

Method for Measuring W

As for the W, the lengths of the ceramic capacitors in the width direction were measured with the use of a microscope.

Method for Measuring S1

The S1 was calculated as a product of the values obtained by measuring, at the first or second end surface, the length of an exposed portion of the capacitor main body exposed from the first and second external electrodes in the width direction W and the length of the exposed portion of the capacitor main body exposed from the first and second external electrodes in the thickness direction T with the use of a microscope. It is to be noted that the length of the exposed portion of the capacitor main body in the width direction W was measured in the center of the ceramic capacitor in the thickness direction T. The length of the exposed portion of the capacitor main body in the thickness direction T was measured in the center of the ceramic capacitor in the width direction W.

Method for Measuring S2

The S2 was calculated as follows. First, the first length of the first or second external electrode in the width direction W of the capacitor main body when viewed in a direction perpendicular or substantially perpendicular to the first or second end surface and the second length of the first or second external electrode in the thickness direction T of the capacitor main body when viewed in a direction perpendicular or substantially perpendicular to the first or second end surface were measured with the use of a microscope, and a product of the values of the first and second lengths was obtained. Thereafter, the value of S2 was calculated by subtracting the value of S1 from the obtained product.

Method for Measuring L1

The length in the length direction L, of a central portion of the ceramic capacitor prepared according to Example 1 in the width direction thereof, was divided by the length in the length direction L, of a central portion of the ceramic capacitor prepared according to each of Examples 2 to 161 in the width direction thereof, and the obtained values were halved and regarded as L1. It is to be noted that the lengths were measured with the use of a micrometer.

TABLE 2

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 1 | 0% | 0 | 0% | 0 | 0% | 0 | 0% | 0 | 0.132 | 0.000 | 0 | 0/1000 | 5/1000 | 0/1000 |
| Experimental Example 2 | 5% | 11 | 5% | 11 | 5% | 30 | 5% | 30 | 0.107 | 0.025 | 5 | 0/1000 | 0/1000 | 0/1000 |
| Experimental Example 3 | 5% | 11 | 10% | 22 | 5% | 30 | 5% | 30 | 0.101 | 0.031 | 8 | 0/1000 | 0/1000 | 0/1000 |
| Experimental Example 4 | 5% | 11 | 15% | 33 | 5% | 30 | 5% | 30 | 0.095 | 0.037 | 12 | 0/1000 | 0/1000 | 0/1000 |
| Experimental Example 5 | 5% | 11 | 20% | 44 | 5% | 30 | 5% | 30 | 0.089 | 0.043 | 16 | 0/1000 | 0/1000 | 0/1000 |
| Experimental Example 6 | 10% | 22 | 5% | 11 | 5% | 30 | 5% | 30 | 0.101 | 0.031 | 8 | 0/1000 | 0/1000 | 0/1000 |
| Experimental Example 7 | 10% | 22 | 10% | 22 | 5% | 30 | 5% | 30 | 0.095 | 0.037 | 8 | 0/1000 | 0/1000 | 0/1000 |
| Experimental Example 8 | 10% | 22 | 15% | 33 | 5% | 30 | 5% | 30 | 0.089 | 0.043 | 12 | 0/1000 | 0/1000 | 0/1000 |
| Experimental Example 9 | 10% | 22 | 20% | 44 | 5% | 30 | 5% | 30 | 0.083 | 0.049 | 16 | 0/1000 | 0/1000 | 1/1000 |
| Experimental Example 10 | 15% | 33 | 5% | 11 | 5% | 30 | 5% | 30 | 0.095 | 0.037 | 12 | 0/1000 | 0/1000 | 0/1000 |
| Experimental Example 11 | 15% | 33 | 10% | 22 | 5% | 30 | 5% | 30 | 0.089 | 0.043 | 12 | 0/1000 | 0/1000 | 0/1000 |
| Experimental Example 12 | 15% | 33 | 15% | 33 | 5% | 30 | 5% | 30 | 0.083 | 0.049 | 12 | 0/1000 | 0/1000 | 0/1000 |
| Experimental Example 13 | 15% | 33 | 20% | 44 | 5% | 30 | 5% | 30 | 0.077 | 0.055 | 16 | 0/1000 | 0/1000 | 1/1000 |
| Experimental Example 14 | 20% | 44 | 5% | 11 | 5% | 30 | 5% | 30 | 0.089 | 0.043 | 16 | 0/1000 | 0/1000 | 1/1000 |
| Experimental Example 15 | 20% | 44 | 10% | 22 | 5% | 30 | 5% | 30 | 0.083 | 0.049 | 16 | 0/1000 | 0/1000 | 2/1000 |
| Experimental Example 16 | 20% | 44 | 15% | 33 | 5% | 30 | 5% | 30 | 0.077 | 0.055 | 16 | 0/1000 | 0/1000 | 2/1000 |
| Experimental Example 17 | 20% | 44 | 20% | 44 | 5% | 30 | 5% | 30 | 0.071 | 0.061 | 16 | 1/1000 | 0/1000 | 1/1000 |

TABLE 3

| | T1/T | T1 (μm) | T2/T | T2 (μm) | W1/W | W1 (μm) | W2/W | W2 (μm) | S1 (mm$^2$) | S2 (mm$^2$) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 18 | 5% | 11 | 5% | 11 | 10% | 60 | 5% | 30 | 0.101 | 0.031 | 10 | 0/1000 | 0/1000 | 0/1000 |
| Experimental Example 19 | 5% | 11 | 10% | 22 | 10% | 60 | 5% | 30 | 0.095 | 0.037 | 10 | 0/1000 | 0/1000 | 0/1000 |
| Experimental Example 20 | 5% | 11 | 15% | 33 | 10% | 60 | 5% | 30 | 0.090 | 0.042 | 12 | 0/1000 | 0/1000 | 0/1000 |
| Experimental Example 21 | 5% | 11 | 20% | 44 | 10% | 60 | 5% | 30 | 0.084 | 0.048 | 16 | 0/1000 | 0/1000 | 1/1000 |
| Experimental Example 22 | 10% | 22 | 5% | 11 | 10% | 60 | 5% | 30 | 0.095 | 0.037 | 10 | 0/1000 | 0/1000 | 0/1000 |
| Experimental Example 23 | 10% | 22 | 10% | 22 | 10% | 60 | 5% | 30 | 0.090 | 0.042 | 10 | 0/1000 | 0/1000 | 0/1000 |
| Experimental Example 24 | 10% | 22 | 15% | 33 | 10% | 60 | 5% | 30 | 0.084 | 0.048 | 12 | 0/1000 | 0/1000 | 0/1000 |
| Experimental Example 25 | 10% | 22 | 20% | 44 | 10% | 60 | 5% | 30 | 0.079 | 0.053 | 16 | 0/1000 | 0/1000 | 2/1000 |
| Experimental Example 26 | 15% | 33 | 5% | 11 | 10% | 60 | 5% | 30 | 0.090 | 0.042 | 12 | 0/1000 | 0/1000 | 0/1000 |
| Experimental Example 27 | 15% | 33 | 10% | 22 | 10% | 60 | 5% | 30 | 0.084 | 0.048 | 12 | 0/1000 | 0/1000 | 0/1000 |
| Experimental Example 28 | 15% | 33 | 15% | 33 | 10% | 60 | 5% | 30 | 0.079 | 0.053 | 12 | 0/1000 | 0/1000 | 0/1000 |
| Experimental Example 29 | 15% | 33 | 20% | 44 | 10% | 60 | 5% | 30 | 0.073 | 0.059 | 16 | 0/1000 | 0/1000 | 2/1000 |
| Experimental Example 30 | 20% | 44 | 5% | 11 | 10% | 60 | 5% | 30 | 0.084 | 0.048 | 16 | 0/1000 | 0/1000 | 1/1000 |
| Experimental Example 31 | 20% | 44 | 10% | 22 | 10% | 60 | 5% | 30 | 0.079 | 0.053 | 16 | 0/1000 | 0/1000 | 1/1000 |
| Experimental Example 32 | 20% | 44 | 15% | 33 | 10% | 60 | 5% | 30 | 0.073 | 0.059 | 16 | 0/1000 | 0/1000 | 2/1000 |
| Experimental Example 33 | 20% | 44 | 20% | 44 | 10% | 60 | 5% | 30 | 0.067 | 0.065 | 16 | 2/1000 | 0/1000 | 2/1000 |

TABLE 4

| | T1/T | T1 (μm) | T2/T | T2 (μm) | W1/W | W1 (μm) | W2/W | W2 (μm) | S1 (mm$^2$) | S2 (mm$^2$) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 34 | 5% | 11 | 5% | 11 | 15% | 90 | 5% | 30 | 0.095 | 0.037 | 15 | 0/1000 | 0/1000 | 0/1000 |
| Experimental Example 35 | 5% | 11 | 10% | 22 | 15% | 90 | 5% | 30 | 0.090 | 0.042 | 15 | 0/1000 | 0/1000 | 0/1000 |
| Experimental Example 36 | 5% | 11 | 15% | 33 | 15% | 90 | 5% | 30 | 0.084 | 0.048 | 15 | 0/1000 | 0/1000 | 0/1000 |
| Experimental Example 37 | 5% | 11 | 20% | 44 | 15% | 90 | 5% | 30 | 0.079 | 0.053 | 16 | 0/1000 | 0/1000 | 1/1000 |
| Experimental Example 38 | 10% | 22 | 5% | 11 | 15% | 90 | 5% | 30 | 0.090 | 0.042 | 15 | 0/1000 | 0/1000 | 0/1000 |
| Experimental Example 39 | 10% | 22 | 10% | 22 | 15% | 90 | 5% | 30 | 0.084 | 0.048 | 15 | 0/1000 | 0/1000 | 0/1000 |
| Experimental Example 40 | 10% | 22 | 15% | 33 | 15% | 90 | 5% | 30 | 0.079 | 0.053 | 15 | 0/1000 | 0/1000 | 0/1000 |
| Experimental Example 41 | 10% | 22 | 20% | 44 | 15% | 90 | 5% | 30 | 0.074 | 0.058 | 16 | 0/1000 | 0/1000 | 1/1000 |
| Experimental Example 42 | 15% | 33 | 5% | 11 | 15% | 90 | 5% | 30 | 0.084 | 0.048 | 15 | 0/1000 | 0/1000 | 0/1000 |
| Experimental Example 43 | 15% | 33 | 10% | 22 | 15% | 90 | 5% | 30 | 0.079 | 0.053 | 15 | 0/1000 | 0/1000 | 0/1000 |
| Experimental Example 44 | 15% | 33 | 15% | 33 | 15% | 90 | 5% | 30 | 0.074 | 0.058 | 15 | 0/1000 | 0/1000 | 0/1000 |
| Experimental Example 45 | 15% | 33 | 20% | 44 | 15% | 90 | 5% | 30 | 0.069 | 0.063 | 16 | 2/1000 | 0/1000 | 1/1000 |

TABLE 4-continued

| | T1/T | T1 (μm) | T2/T | T2 (μm) | W1/W | W1 (μm) | W2/W | W2 (μm) | S1 (mm$^2$) | S2 (mm$^2$) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 46 | 20% | 44 | 5% | 11 | 15% | 90 | 5% | 30 | 0.079 | 0.053 | 16 | 0/1000 | 0/1000 | 1/1000 |
| Experimental Example 47 | 20% | 44 | 10% | 22 | 15% | 90 | 5% | 30 | 0.074 | 0.058 | 16 | 0/1000 | 0/1000 | 2/1000 |
| Experimental Example 48 | 20% | 44 | 15% | 33 | 15% | 90 | 5% | 30 | 0.069 | 0.063 | 16 | 1/1000 | 0/1000 | 2/1000 |
| Experimental Example 49 | 20% | 44 | 20% | 44 | 15% | 90 | 5% | 30 | 0.063 | 0.069 | 16 | 3/1000 | 0/1000 | 2/1000 |

TABLE 5

| | T1/T | T1 (μm) | T2/T | T2 (μm) | W1/W | W1 (μm) | W2/W | W2 (μm) | S1 (mm$^2$) | S2 (mm$^2$) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 50 | 5% | 11 | 5% | 11 | 20% | 120 | 5% | 30 | 0.089 | 0.043 | 20 | 0/1000 | 0/1000 | 3/1000 |
| Experimental Example 51 | 5% | 11 | 10% | 22 | 20% | 120 | 5% | 30 | 0.084 | 0.048 | 20 | 0/1000 | 0/1000 | 2/1000 |
| Experimental Example 52 | 5% | 11 | 15% | 33 | 20% | 120 | 5% | 30 | 0.079 | 0.053 | 20 | 0/1000 | 0/1000 | 3/1000 |
| Experimental Example 53 | 5% | 11 | 20% | 44 | 20% | 120 | 5% | 30 | 0.074 | 0.058 | 20 | 0/1000 | 0/1000 | 4/1000 |
| Experimental Example 54 | 10% | 22 | 5% | 11 | 20% | 120 | 5% | 30 | 0.084 | 0.048 | 20 | 0/1000 | 0/1000 | 3/1000 |
| Experimental Example 55 | 10% | 22 | 10% | 22 | 20% | 120 | 5% | 30 | 0.079 | 0.053 | 20 | 0/1000 | 0/1000 | 3/1000 |
| Experimental Example 56 | 10% | 22 | 15% | 33 | 20% | 120 | 5% | 30 | 0.074 | 0.058 | 20 | 0/1000 | 0/1000 | 3/1000 |
| Experimental Example 57 | 10% | 22 | 20% | 44 | 20% | 120 | 5% | 30 | 0.069 | 0.063 | 20 | 1/1000 | 0/1000 | 4/1000 |
| Experimental Example 58 | 15% | 33 | 5% | 11 | 20% | 120 | 5% | 30 | 0.079 | 0.053 | 20 | 0/1000 | 0/1000 | 3/1000 |
| Experimental Example 59 | 15% | 33 | 10% | 22 | 20% | 120 | 5% | 30 | 0.074 | 0.058 | 20 | 0/1000 | 0/1000 | 2/1000 |
| Experimental Example 60 | 15% | 33 | 15% | 33 | 20% | 120 | 5% | 30 | 0.069 | 0.063 | 20 | 1/1000 | 0/1000 | 3/1000 |
| Experimental Example 61 | 15% | 33 | 20% | 44 | 20% | 120 | 5% | 30 | 0.064 | 0.068 | 20 | 2/1000 | 0/1000 | 5/1000 |
| Experimental Example 62 | 20% | 44 | 5% | 11 | 20% | 120 | 5% | 30 | 0.074 | 0.058 | 20 | 0/1000 | 0/1000 | 3/1000 |
| Experimental Example 63 | 20% | 44 | 10% | 22 | 20% | 120 | 5% | 30 | 0.069 | 0.063 | 20 | 2/1000 | 0/1000 | 4/1000 |
| Experimental Example 64 | 20% | 44 | 15% | 33 | 20% | 120 | 5% | 30 | 0.064 | 0.068 | 20 | 2/1000 | 0/1000 | 3/1000 |
| Experimental Example 65 | 20% | 44 | 20% | 44 | 20% | 120 | 5% | 30 | 0.059 | 0.073 | 20 | 4/1000 | 0/1000 | 5/1000 |

TABLE 6

|  | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 68 | 5% | 11 | 15% | 33 | 10% | 60 | 10% | 60 | 0.084 | 0.048 | 12 | 0/1000 | 0/1000 | 0/1000 |
| Experimental Example 69 | 5% | 11 | 20% | 44 | 10% | 60 | 10% | 60 | 0.079 | 0.053 | 16 | 0/1000 | 0/1000 | 1/1000 |
| Experimental Example 70 | 10% | 22 | 5% | 11 | 10% | 60 | 10% | 60 | 0.090 | 0.042 | 10 | 0/1000 | 0/1000 | 0/1000 |
| Experimental Example 71 | 10% | 22 | 10% | 22 | 10% | 60 | 10% | 60 | 0.084 | 0.048 | 10 | 0/1000 | 0/1000 | 0/1000 |
| Experimental Example 72 | 10% | 22 | 15% | 33 | 10% | 60 | 10% | 60 | 0.079 | 0.053 | 12 | 0/1000 | 0/1000 | 0/1000 |
| Experimental Example 73 | 10% | 22 | 20% | 44 | 10% | 60 | 10% | 60 | 0.074 | 0.058 | 16 | 0/1000 | 0/1000 | 1/1000 |
| Experimental Example 74 | 15% | 33 | 5% | 11 | 10% | 60 | 10% | 60 | 0.084 | 0.048 | 12 | 0/1000 | 0/1000 | 0/1000 |
| Experimental Example 75 | 15% | 33 | 10% | 22 | 10% | 60 | 10% | 60 | 0.079 | 0.053 | 12 | 0/1000 | 0/1000 | 0/1000 |
| Experimental Example 76 | 15% | 33 | 15% | 33 | 10% | 60 | 10% | 60 | 0.074 | 0.058 | 12 | 0/1000 | 0/1000 | 0/1000 |
| Experimental Example 77 | 15% | 33 | 20% | 44 | 10% | 60 | 10% | 60 | 0.069 | 0.063 | 16 | 1/1000 | 0/1000 | 1/1000 |
| Experimental Example 78 | 20% | 44 | 5% | 11 | 10% | 60 | 10% | 60 | 0.079 | 0.053 | 16 | 0/1000 | 0/1000 | 2/1000 |
| Experimental Example 79 | 20% | 44 | 10% | 22 | 10% | 60 | 10% | 60 | 0.074 | 0.058 | 16 | 0/1000 | 0/1000 | 1/1000 |
| Experimental Example 80 | 20% | 44 | 15% | 33 | 10% | 60 | 10% | 60 | 0.069 | 0.063 | 16 | 2/1000 | 0/1000 | 1/1000 |
| Experimental Example 81 | 20% | 44 | 20% | 44 | 10% | 60 | 10% | 60 | 0.063 | 0.069 | 16 | 2/1000 | 0/1000 | 1/1000 |

TABLE 7

|  | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 82 | 5% | 11 | 5% | 11 | 15% | 90 | 10% | 60 | 0.089 | 0.043 | 15 | 0/1000 | 0/1000 | 0/1000 |
| Experimental Example 83 | 5% | 11 | 10% | 22 | 15% | 90 | 10% | 60 | 0.084 | 0.048 | 15 | 0/1000 | 0/1000 | 0/1000 |
| Experimental Example 84 | 5% | 11 | 15% | 33 | 15% | 90 | 10% | 00 | 0.079 | 0.053 | 15 | 0/1000 | 0/1000 | 0/1000 |
| Experimental Example 85 | 5% | 11 | 20% | 44 | 15% | 90 | 10% | 60 | 0.074 | 0.058 | 16 | 0/1000 | 0/1000 | 1/1000 |
| Experimental Example 86 | 10% | 22 | 5% | 11 | 15% | 90 | 10% | 60 | 0.084 | 0.048 | 15 | 0/1000 | 0/1000 | 0/1000 |
| Experimental Example 87 | 10% | 22 | 10% | 22 | 15% | 90 | 10% | 60 | 0.079 | 0.053 | 15 | 0/1000 | 0/1000 | 0/1000 |
| Experimental Example 88 | 10% | 22 | 15% | 33 | 15% | 90 | 10% | 60 | 0.074 | 0.058 | 15 | 0/1000 | 0/1000 | 0/1000 |
| Experimental Example 89 | 10% | 22 | 20% | 44 | 15% | 90 | 10% | 60 | 0.069 | 0.063 | 16 | 2/1000 | 0/1000 | 1/1000 |
| Experimental Example 90 | 15% | 33 | 5% | 11 | 15% | 90 | 10% | 60 | 0.079 | 0.053 | 15 | 0/1000 | 0/1000 | 0/1000 |
| Experimental Example 91 | 15% | 33 | 10% | 22 | 15% | 90 | 10% | 60 | 0.074 | 0.058 | 15 | 0/1000 | 0/1000 | 0/1000 |
| Experimental Example 92 | 15% | 33 | 15% | 33 | 15% | 90 | 10% | 60 | 0.069 | 0.063 | 15 | 1/1000 | 0/1000 | 0/1000 |
| Experimental Example 93 | 15% | 33 | 20% | 44 | 15% | 90 | 10% | 60 | 0.064 | 0.068 | 16 | 2/1000 | 0/1000 | 1/1000 |
| Experimental Example 94 | 20% | 44 | 5% | 11 | 15% | 90 | 10% | 60 | 0.074 | 0.058 | 16 | 0/1000 | 0/1000 | 1/1000 |
| Experimental Example 95 | 20% | 44 | 10% | 22 | 15% | 90 | 10% | 60 | 0.069 | 0.063 | 16 | 1/1000 | 0/1000 | 1/1000 |

TABLE 7-continued

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 96 | 20% | 44 | 15% | 33 | 15% | 90 | 10% | 60 | 0.064 | 0.068 | 16 | 1/1000 | 0/1000 | 1/1000 |
| Experimental Example 97 | 20% | 44 | 20% | 44 | 15% | 90 | 10% | 60 | 0.059 | 0.073 | 16 | 3/1000 | 0/1000 | 1/1000 |

TABLE 8

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 98 | 5% | 11 | 5% | 11 | 20% | 120 | 10% | 60 | 0.083 | 0.049 | 20 | 0/1000 | 0/1000 | 3/1000 |
| Experimental Example 99 | 5% | 11 | 10% | 22 | 20% | 120 | 10% | 60 | 0.079 | 0.053 | 20 | 0/1000 | 0/1000 | 2/1000 |
| Experimental Example 100 | 5% | 11 | 15% | 33 | 20% | 120 | 10% | 60 | 0.074 | 0.058 | 20 | 0/1000 | 0/1000 | 3/1000 |
| Experimental Example 101 | 5% | 11 | 20% | 44 | 20% | 120 | 10% | 60 | 0.069 | 0.063 | 20 | 1/1000 | 0/1000 | 2/1000 |
| Experimental Example 102 | 10% | 22 | 5% | 11 | 20% | 120 | 10% | 60 | 0.079 | 0.053 | 20 | 0/1000 | 0/1000 | 3/1000 |
| Experimental Example 103 | 10% | 22 | 10% | 22 | 20% | 120 | 10% | 60 | 0.074 | 0.058 | 20 | 0/1000 | 0/1000 | 3/1000 |
| Experimental Example 104 | 10% | 22 | 15% | 33 | 20% | 120 | 10% | 60 | 0.069 | 0.063 | 20 | 0/1000 | 0/1000 | 4/1000 |
| Experimental Example 105 | 10% | 22 | 20% | 44 | 20% | 120 | 10% | 60 | 0.065 | 0.067 | 20 | 1/1000 | 0/1000 | 4/1000 |
| Experimental Example 106 | 15% | 33 | 5% | 11 | 20% | 120 | 10% | 60 | 0.074 | 0.058 | 20 | 0/1000 | 0/1000 | 2/1000 |
| Experimental Example 107 | 15% | 33 | 10% | 22 | 20% | 120 | 10% | 60 | 0.069 | 0.063 | 20 | 0/1000 | 0/1000 | 2/1000 |
| Experimental Example 108 | 15% | 33 | 15% | 33 | 20% | 120 | 10% | 60 | 0.065 | 0.067 | 20 | 0/1000 | 0/1000 | 3/1000 |
| Experimental Example 109 | 15% | 33 | 20% | 44 | 20% | 120 | 10% | 60 | 0.060 | 0.072 | 20 | 2/1000 | 0/1000 | 5/1000 |
| Experimental Example 110 | 20% | 44 | 5% | 11 | 20% | 120 | 10% | 60 | 0.069 | 0.063 | 20 | 1/1000 | 0/1000 | 3/1000 |
| Experimental Example 111 | 20% | 44 | 10% | 22 | 20% | 120 | 10% | 60 | 0.065 | 0.067 | 20 | 1/1000 | 0/1000 | 4/1000 |
| Experimental Example 112 | 20% | 44 | 15% | 33 | 20% | 120 | 10% | 60 | 0.060 | 0.072 | 20 | 3/1000 | 0/1000 | 3/1000 |
| Experimental Example 113 | 20% | 44 | 20% | 44 | 20% | 120 | 10% | 60 | 0.055 | 0.077 | 20 | 4/1000 | 0/1000 | 4/1000 |

TABLE 9

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 114 | 5% | 11 | 5% | 11 | 15% | 90 | 15% | 90 | 0.083 | 0.049 | 15 | 0/1000 | 0/1000 | 0/1000 |
| Experimental Example 115 | 5% | 11 | 10% | 22 | 15% | 90 | 15% | 90 | 0.079 | 0.053 | 15 | 0/1000 | 0/1000 | 0/1000 |
| Experimental Example 116 | 5% | 11 | 15% | 33 | 15% | 90 | 15% | 90 | 0.074 | 0.058 | 15 | 0/1000 | 0/1000 | 0/1000 |
| Experimental Example 117 | 5% | 11 | 20% | 44 | 15% | 90 | 15% | 90 | 0.069 | 0.063 | 16 | 1/1000 | 0/1000 | 1/1000 |

TABLE 9-continued

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 118 | 10% | 22 | 5% | 11 | 15% | 90 | 15% | 90 | 0.079 | 0.053 | 15 | 0/1000 | 0/1000 | 0/1000 |
| Experimental Example 119 | 10% | 22 | 10% | 22 | 15% | 90 | 15% | 90 | 0.074 | 0.058 | 15 | 0/1000 | 0/1000 | 0/1000 |
| Experimental Example 120 | 10% | 22 | 15% | 33 | 15% | 90 | 15% | 90 | 0.069 | 0.063 | 15 | 1/1000 | 0/1000 | 0/1000 |
| Experimental Example 121 | 10% | 22 | 20% | 44 | 15% | 90 | 15% | 90 | 0.065 | 0.067 | 16 | 2/1000 | 0/1000 | 1/1000 |
| Experimental Example 122 | 15% | 33 | 5% | 11 | 15% | 90 | 15% | 90 | 0.074 | 0.058 | 15 | 0/1000 | 0/1000 | 0/1000 |
| Experimental Example 123 | 15% | 33 | 10% | 22 | 15% | 90 | 15% | 90 | 0.069 | 0.063 | 15 | 1/1000 | 0/1000 | 0/1000 |
| Experimental Example 124 | 15% | 33 | 15% | 33 | 15% | 90 | 15% | 90 | 0.065 | 0.067 | 15 | 1/1000 | 0/1000 | 0/1000 |
| Experimental Example 125 | 15% | 33 | 20% | 44 | 15% | 90 | 15% | 90 | 0.060 | 0.072 | 16 | 3/1000 | 0/1000 | 2/1000 |
| Experimental Example 126 | 20% | 44 | 5% | 11 | 15% | 90 | 15% | 90 | 0.069 | 0.063 | 16 | 1/1000 | 0/1000 | 2/1000 |
| Experimental Example 127 | 20% | 44 | 10% | 22 | 15% | 90 | 15% | 90 | 0.065 | 0.067 | 16 | 2/1000 | 0/1000 | 1/1000 |
| Experimental Example 128 | 20% | 44 | 15% | 33 | 15% | 90 | 15% | 90 | 0.060 | 0.072 | 16 | 3/1000 | 0/1000 | 1/1000 |
| Experimental Example 129 | 20% | 44 | 20% | 44 | 15% | 90 | 15% | 90 | 0.055 | 0.077 | 16 | 4/1000 | 0/1000 | 3/1000 |

TABLE 10

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 130 | 5% | 11 | 5% | 11 | 20% | 120 | 15% | 90 | 0.077 | 0.055 | 20 | 0/1000 | 0/1000 | 3/1000 |
| Experimental Example 131 | 5% | 11 | 10% | 22 | 20% | 120 | 15% | 90 | 0.073 | 0.059 | 20 | 0/1000 | 0/1000 | 3/1000 |
| Experimental Example 132 | 5% | 11 | 15% | 33 | 20% | 120 | 15% | 90 | 0.069 | 0.063 | 20 | 1/1000 | 0/1000 | 3/1000 |
| Experimental Example 133 | 5% | 11 | 20% | 44 | 20% | 120 | 15% | 90 | 0.064 | 0.068 | 20 | 1/1000 | 0/1000 | 2/1000 |
| Experimental Example 134 | 10% | 22 | 5% | 11 | 20% | 120 | 15% | 90 | 0.073 | 0.059 | 20 | 0/1000 | 0/1000 | 3/1000 |
| Experimental Example 135 | 10% | 22 | 10% | 22 | 20% | 120 | 15% | 90 | 0.069 | 0.063 | 20 | 1/1000 | 0/1000 | 3/1000 |
| Experimental Example 136 | 10% | 22 | 15% | 33 | 20% | 120 | 15% | 90 | 0.064 | 0.068 | 20 | 1/1000 | 0/1000 | 3/1000 |
| Experimental Example 137 | 10% | 22 | 20% | 44 | 20% | 120 | 15% | 90 | 0.060 | 0.072 | 20 | 2/1000 | 0/1000 | 4/1000 |
| Experimental Example 138 | 15% | 33 | 5% | 11 | 20% | 120 | 15% | 90 | 0.069 | 0.063 | 20 | 1/1000 | 0/1000 | 3/1000 |
| Experimental Example 139 | 15% | 33 | 10% | 22 | 20% | 120 | 15% | 90 | 0.064 | 0.068 | 20 | 1/1000 | 0/1000 | 2/1000 |
| Experimental Example 140 | 15% | 33 | 15% | 33 | 20% | 120 | 15% | 90 | 0.060 | 0.072 | 20 | 3/1000 | 0/1000 | 3/1000 |
| Experimental Example 141 | 15% | 33 | 20% | 44 | 20% | 120 | 15% | 90 | 0.056 | 0.076 | 20 | 3/1000 | 0/1000 | 4/1000 |
| Experimental Example 142 | 20% | 44 | 5% | 11 | 20% | 120 | 15% | 90 | 0.064 | 0.068 | 20 | 1/1000 | 0/1000 | 3/1000 |
| Experimental Example 143 | 20% | 44 | 10% | 22 | 20% | 120 | 15% | 90 | 0.060 | 0.072 | 20 | 2/1000 | 0/1000 | 4/1000 |
| Experimental Example 144 | 20% | 44 | 15% | 33 | 20% | 120 | 15% | 90 | 0.056 | 0.076 | 20 | 2/1000 | 0/1000 | 5/1000 |
| Experimental Example 145 | 20% | 44 | 20% | 44 | 20% | 120 | 15% | 90 | 0.051 | 0.081 | 20 | 4/1000 | 0/1000 | 4/1000 |

TABLE 11

| | T1/T | T1 (μm) | T2/T | T2 (μm) | W1/W | W1 (μm) | W2/W | W2 (μm) | S1 (mm²) | S2 (mm²) | L1 (μm) | Number of Defective Adhesion Products/ Number of Samples | Number of Broken or Cracked Defective Products/ Number of Samples | Number of Defectively Mounted Products/ Number of Samples |
|---|---|---|---|---|---|---|---|---|---|---|---|---|---|---|
| Experimental Example 146 | 5% | 11 | 5% | 11 | 20% | 120 | 20% | 120 | 0.071 | 0.061 | 20 | 1/1000 | 0/1000 | 3/1000 |
| Experimental Example 147 | 5% | 11 | 10% | 22 | 20% | 120 | 20% | 120 | 0.067 | 0.065 | 20 | 1/1000 | 0/1000 | 4/1000 |
| Experimental Example 148 | 5% | 11 | 15% | 33 | 20% | 120 | 20% | 120 | 0.063 | 0.069 | 20 | 1/1000 | 0/1000 | 3/1000 |
| Experimental Example 149 | 5% | 11 | 20% | 44 | 20% | 120 | 20% | 120 | 0.059 | 0.073 | 20 | 1/1000 | 0/1000 | 3/1000 |
| Experimental Example 150 | 10% | 22 | 5% | 11 | 20% | 120 | 20% | 120 | 0.067 | 0.065 | 20 | 1/1000 | 0/1000 | 3/1000 |
| Experimental Example 151 | 10% | 22 | 10% | 22 | 20% | 120 | 20% | 120 | 0.063 | 0.069 | 20 | 1/1000 | 0/1000 | 3/1000 |
| Experimental Example 152 | 10% | 22 | 15% | 33 | 20% | 120 | 20% | 120 | 0.059 | 0.073 | 20 | 1/1000 | 0/1000 | 4/1000 |
| Experimental Example 153 | 10% | 22 | 20% | 44 | 20% | 120 | 20% | 120 | 0.055 | 0.077 | 20 | 1/1000 | 0/1000 | 3/1000 |
| Experimental Example 154 | 15% | 33 | 5% | 11 | 20% | 120 | 20% | 120 | 0.063 | 0.069 | 20 | 1/1000 | 0/1000 | 4/1000 |
| Experimental Example 155 | 15% | 33 | 10% | 22 | 20% | 120 | 20% | 120 | 0.059 | 0.073 | 20 | 1/1000 | 0/1000 | 3/1000 |
| Experimental Example 156 | 15% | 33 | 15% | 33 | 20% | 120 | 20% | 120 | 0.055 | 0.077 | 20 | 1/1000 | 0/1000 | 3/1000 |
| Experimental Example 157 | 15% | 33 | 20% | 44 | 20% | 120 | 20% | 120 | 0.051 | 0.081 | 20 | 1/1000 | 0/1000 | 5/1000 |
| Experimental Example 158 | 20% | 44 | 5% | 11 | 20% | 120 | 20% | 120 | 0.059 | 0.073 | 20 | 1/1000 | 0/1000 | 3/1000 |
| Experimental Example 159 | 20% | 44 | 10% | 22 | 20% | 120 | 20% | 120 | 0.055 | 0.077 | 20 | 1/1000 | 0/1000 | 5/1000 |
| Experimental Example 160 | 20% | 44 | 15% | 33 | 20% | 120 | 20% | 120 | 0.051 | 0.081 | 20 | 1/1000 | 0/1000 | 4/1000 |
| Experimental Example 161 | 20% | 44 | 20% | 44 | 20% | 120 | 20% | 120 | 0.048 | 0.084 | 20 | 1/1000 | 0/1000 | 6/1000 |

According to the results shown in Tables 2 to 11, the ratios T1/T, T2/T, W1/W, and W2/W are adjusted to about 5% or more and about 15% or less, for example, thus making it possible to expose, in an optimum range, the exposed portions of the capacitor main body 10 which have a higher adhesion to the substrate than the surfaces of the external electrodes. For this reason, when the capacitor is built into a substrate, defective adhesion to the substrate significantly reduced or prevented in an effective manner, thus protecting ridges of the capacitor main body 10. Therefore, the ceramic capacitor is effectively prevented from being broken or cracked. In addition, the lengths of the third and fourth portions 15c, 15d of the first external electrode 15, and of the seventh and eighth portions 16c, 16d of the second external electrode 16 are adapted to fall within the appropriate range, thus making also it possible to control the dimensions of the external electrodes in the length direction of the ceramic capacitor 1. Accordingly, it is determined that the multilayer ceramic capacitor is unlikely to be defectively inserted into a cavity of a substrate on which the capacitor is to be mounted, thus making it possible to prevent defective mounting in an effective manner.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A ceramic capacitor comprising:
a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
a plurality of internal electrodes disposed in the capacitor main body, and exposed at each of the first and second side surfaces; and
a plurality of external electrodes extending over from exposed portions of the internal electrodes at the first side surface and exposed portions of the internal electrodes at the second side surface to the first and second principal surfaces; wherein
each of the plurality of internal electrodes includes:
 a first internal electrode; and
 a second internal electrode opposed to the first internal electrode in the laminating direction;
the first internal electrode includes:
 a first opposed portion opposed to the second internal electrode;
 first and second extended portions connected to the first opposed portion, and each extended to the first side surface; and
 third and fourth extended portions connected to the first opposed portion, and each extended to the second side surface;

the first internal electrode is spaced away from the first and second end surfaces of the capacitor main body;

the second internal electrode includes:
- a second opposed portion opposed to the first opposed portion;
- a fifth extended portion connected to the second opposed portion, and extended to the first side surface; and
- a sixth extended portion connected to the second opposed portion, and extended to the second side surface;

each of the plurality of external electrodes includes:
- a first external electrode covering an exposed portion of the first extended portion at the first side surface and an exposed portion of the third extended portion at the second side surface, and wrapping around the first side surface, the first principal surface, the second side surface, and the second principal surface;
- a second external electrode covering an exposed portion of the second extended portion at the first side surface and an exposed portion of the fourth extended portion at the second side surface, and wrapping around the first side surface, the first principal surface, the second side surface, and the second principal surface; and
- a third external electrode covering an exposed portion of the fifth extended portion at the first side surface and an exposed portion of the sixth extended portion at the second side surface, and wrapping around the first side surface, the first principal surface, the second side surface, and the second principal surface;

the first external electrode includes:
- a first portion extending from a portion located on the first principal surface to a portion of the first end surface;
- a second portion extending from a portion located on the second principal surface to a portion of the first end surface;
- a third portion extending from a portion located on the first side surface to a portion of the first end surface; and
- a fourth portion extending from a portion located on the second side surface to a portion of the first end surface;

the second external electrode includes:
- a fifth portion extending from a portion located on the first principal surface to a portion of the second end surface;
- a sixth portion extending from a portion located on the second principal surface to a portion of the second end surface;
- a seventh portion extending from a portion located on the first side surface to a portion of the second end surface; and
- an eighth portion extending from a portion located on the second side surface to a portion of the second end surface;

each of the first and second external electrodes includes an outermost layer including a Cu plated layer;

lengths of the first and second portions, and lengths of the fifth and sixth portions in the laminating direction are each about 5% or more and about 15% or less of a dimension of the ceramic capacitor in the laminating direction; and lengths of the third and fourth portions, and lengths of the seventh and eighth portions in the laminating direction are each about 5% or more and about 15% or less of a width dimension of the ceramic capacitor.

2. The ceramic capacitor according to claim 1, wherein a dimension of the ceramic capacitor in the laminating direction is smaller than a dimension of the ceramic capacitor in the width direction.

3. The ceramic capacitor according to claim 1, wherein a length of a portion of the third external electrode located on the first or second principal surface in the length direction is larger than a length of a portion of the third external electrode located on the first or second side surface in the length direction.

4. The ceramic capacitor according to claim 1, wherein
a length of a portion of the first external electrode located on the first or second principal surface in the length direction is larger than a length of a portion of the first external electrode located on the first and second side surfaces in the length direction; and
a length of a portion of the second external electrode located on the first or second principal surface in the length direction is larger than a length of a portion of the second external electrode located on the first and second side surfaces in the length direction.

5. The ceramic capacitor according to claim 1, wherein
a maximum length of the first and second external electrodes located on the first or second principal surface in the length direction, is L1;
a maximum length of the first and second external electrodes in the length direction from a portion farthest from the capacitor main body in the laminating direction, of the first and second external electrodes located on the first or second principal surface, to a portion retreated to the capacitor main body by about 40% of a thickness of the first or second external electrode in the laminating direction is L2;
a ratio L2/L1 is about 80% or more and 90% or less;
a maximum length of the third external electrode located on the first or second principal surface in the length direction, is L3;
a maximum length of the third external electrode in the length direction from a portion farthest from the capacitor main body in the laminating direction, of the third external electrode located on the first or second principal surface, to a portion retreated to the capacitor main body by about 40% of a thickness of the third external electrode in the laminating direction is L4;
a ratio L4/L3 is about 80% or more.

6. The ceramic capacitor according to claim 1, wherein a length of a portion of at least one of the first to third external electrodes in contact with the capacitor main body in the length direction is smaller than a length of an uppermost surface of the external electrode in the length direction.

7. The ceramic capacitor according to claim 1, wherein the capacitor main body has a cuboid or substantially cuboid shape.

8. The ceramic capacitor according to claim 1, wherein
a width dimension of the ceramic capacitor is denoted as DW;
a height dimension is of the ceramic capacitor denoted as DT;
a length dimension is of the ceramic capacitor denoted as DL;
DW, DT and DL satisfy following relationships:
DT<DW<DL; and
(about ⅕)DW≤DT≤(about ⅓)DW.

9. The ceramic capacitor according to claim 1, wherein
a width dimension of the ceramic capacitor is denoted as DW;
a height dimension of the ceramic capacitor is denoted as DT;
a length dimension of the ceramic capacitor is denoted as DL;
DW, DT and DL satisfy following relationships:
0.05 mm≤DT≤about 0.25 mm;
about 0.4 mm≤DL≤about 1 mm; and
about 0.3 mm≤DW≤about 0.5 mm.

10. The ceramic capacitor according to claim 1, wherein a dimension of the ceramic capacitor in the laminating direction is about ⅕ times or more and about ½ times or less as large as the width dimension.

11. A ceramic capacitor comprising:
a capacitor main body including first and second principal surfaces extending in a length direction and a width direction perpendicular or substantially perpendicular to the length direction, first and second side surfaces extending in the length direction and a laminating direction perpendicular or substantially perpendicular to each of the length direction and the width direction, and first and second end surfaces extending in the width direction and the laminating direction;
a plurality of internal electrodes disposed in the capacitor main body, and exposed at each of the first and second side surfaces; and
a plurality of external electrodes extending over from exposed portions of the internal electrodes at the first side surface and exposed portions of the internal electrodes at the second side surface to the first and second principal surfaces; wherein
each of the plurality of internal electrodes includes:
a first internal electrode; and
a second internal electrode opposed to the first internal electrode in the laminating direction;
the first internal electrode includes:
a first opposed portion opposed to the second internal electrode;
first and second extended portions connected to the first opposed portion, and each extended to the first side surface; and
third and fourth extended portions connected to the first opposed portion, and each extended to the second side surface;
the first internal electrode is spaced away from the first and second end surfaces of the capacitor main body;
the second internal electrode includes:
a second opposed portion opposed to the first opposed portion;
a fifth extended portion connected to the second opposed portion, and extended to the first side surface; and
a sixth extended portion connected to the second opposed portion, and extended to the second side surface;
each of the plurality of external electrodes includes:
a first external electrode covering an exposed portion of the first extended portion at the first side surface and an exposed portion of the third extended portion at the second side surface, and wrapping around the first side surface, the first principal surface, the second side surface, and the second principal surface;
a second external electrode covering an exposed portion of the second extended portion at the first side surface and an exposed portion of the fourth extended portion at the second side surface, and wrapping around the first side surface, the first principal surface, the second side surface, and the second principal surface; and
a third external electrode covering an exposed portion of the fifth extended portion at the first side surface and an exposed portion of the sixth extended portion at the second side surface, and wrapping around the first side surface, the first principal surface, the second side surface, and the second principal surface;
the first external electrode includes:
a first portion extending from a portion located on the first principal surface to a portion of the first end surface;
a second portion extending from a portion located on the second principal surface to a portion of the first end surface;
a third portion extending from a portion located on the first side surface to a portion of the first end surface; and
a fourth portion extending from a portion located on the second side surface to a portion of the first end surface;
the second external electrode includes:
a fifth portion extending from a portion located on the first principal surface to a portion of the second end surface;
a sixth portion extending from a portion located on the second principal surface to a portion of the second end surface;
a seventh portion extending from a portion located on the first side surface to a portion of the second end surface; and
an eighth portion extending from a portion located on the second side surface to a portion of the second end surface;
each of the first and second external electrodes includes an outermost layer including a Cu plated layer; and
respective lengths of the first, second, fifth, and sixth portions in the laminating direction are smaller than lengths of the third, fourth, seventh, and eighth portions in the width direction.

12. The ceramic capacitor according to claim 11, wherein a dimension of the ceramic capacitor in the laminating direction is smaller than a dimension of the ceramic capacitor in the width direction.

13. The ceramic capacitor according to claim 11, wherein a length of a portion of the third external electrode located on the first or second principal surface in the length direction is larger than a length of a portion of the third external electrode located on the first or second side surface in the length direction.

14. The ceramic capacitor according to claim 11, wherein
a length of a portion of the first external electrode located on the first or second principal surface in the length direction is larger than a length of a portion of the first external electrode located on the first and second side surfaces in the length direction; and
a length of a portion of the second external electrode located on the first or second principal surface in the length direction is larger than a length of a portion of the second external electrode located on the first and second side surfaces in the length direction.

15. The ceramic capacitor according to claim 11, wherein
a maximum length of the first and second external electrodes located on the first or second principal surface in the length direction, is L1;
a maximum length of the first and second external electrodes in the length direction from a portion farthest from the capacitor main body in the laminating direction, of the first and second external electrodes located on the first or second principal surface, to a portion retreated to the capacitor main body by about 40% of a thickness of the first or second external electrode in the laminating direction is L2;
a ratio L2/L1 is about 80% or more and 90% or less;
a maximum length of the third external electrode located on the first or second principal surface in the length direction, is L3;
a maximum length of the third external electrode in the length direction from a portion farthest from the capacitor main body in the laminating direction, of the third external electrode located on the first or second principal surface, to a portion retreated to the capacitor main body by about 40% of a thickness of the third external electrode in the laminating direction is L4;
a ratio L4/L3 is about 80% or more.

16. The ceramic capacitor according to claim 11, wherein a length of a portion of at least one of the first to third external electrodes in contact with the capacitor main body in the length direction is smaller than a length of an uppermost surface of the external electrode in the length direction.

17. The ceramic capacitor according to claim 11, wherein the capacitor main body has a cuboid or substantially cuboid shape.

18. The ceramic capacitor according to claim 11, wherein
a width dimension of the ceramic capacitor is denoted as DW;
a height dimension is of the ceramic capacitor denoted as DT;
a length dimension is of the ceramic capacitor denoted as DL;
DW, DT and DL satisfy following relationships:
DT<DW<DL; and
(about 1/7)DW≤DT≤(about 1/3)DW.

19. The ceramic capacitor according to claim 11, wherein
a width dimension of the ceramic capacitor is denoted as DW;
a height dimension of the ceramic capacitor is denoted as DT;
a length dimension of the ceramic capacitor is denoted as DL;
DW, DT and DL satisfy following relationships:
0.05 mm≤DT<about 0.25 mm;
about 0.4 mm≤DL≤about 1 mm; and
about 0.3 mm≤DW≤about 0.5 mm.

20. The ceramic capacitor according to claim 11, wherein a dimension of the ceramic capacitor in the laminating direction is about 1/5 times or more and about 1/2 times or less as large as the width dimension.

* * * * *